United States Patent
Sun et al.

(10) Patent No.: US 12,165,583 B2
(45) Date of Patent: Dec. 10, 2024

(54) DISPLAY PANEL AND METHOD FOR DRIVING THE SAME, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Kuo Sun, Beijing (CN); Yue Long, Beijing (CN); Yang Wang, Beijing (CN); Zhenhua Zhang, Beijing (CN); Xuan Pang, Beijing (CN); Xiangdong Qin, Beijing (CN)

(73) Assignees: Beijing BOE Technology Development Co., Ltd., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 0 days.

(21) Appl. No.: 17/800,486

(22) PCT Filed: Aug. 5, 2021

(86) PCT No.: PCT/CN2021/110964
§ 371 (c)(1),
(2) Date: Aug. 17, 2022

(87) PCT Pub. No.: WO2022/057503
PCT Pub. Date: Mar. 24, 2022

(65) Prior Publication Data
US 2023/0098206 A1    Mar. 30, 2023

(30) Foreign Application Priority Data

Sep. 18, 2020    (CN) .......................... 202010990185.0

(51) Int. Cl.
*G09G 5/10* (2006.01)
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0426* (2013.01);
(Continued)

(58) Field of Classification Search
CPC ......... G09G 3/3233; G09G 2300/0426; G09G 2300/0819; H10K 59/131
(Continued)

(56) References Cited

U.S. PATENT DOCUMENTS

2015/0364530 A1* 12/2015 Yoon .................... H10K 59/121
257/40
2018/0137808 A1* 5/2018 Na ........................ G09G 3/3233
(Continued)

FOREIGN PATENT DOCUMENTS

CN    107342047 A    11/2017
CN    109560089 A    4/2019
(Continued)

OTHER PUBLICATIONS

First Office Action for Chinese Patent Application No. 202010990185.0 issued by the Chinese Patent Office on Sep. 15, 2022.

*Primary Examiner* — Jonathan M Blancha
(74) *Attorney, Agent, or Firm* — IP & T GROUP LLP

(57) ABSTRACT

A display panel has a first display region, a second display region, a first peripheral region and a second peripheral region. The first peripheral region is located outside the first display region, the second peripheral region is located outside the second display region, and a transmittance of the first display region is greater than a transmittance of the second display region. The display panel includes a sub-
(Continued)

strate, light-emitting devices disposed on the substrate and located in the first display region, first pixel circuits disposed on the substrate and located in the first peripheral region, and a gating circuit disposed on the substrate and coupled to the light-emitting devices and the first pixel circuits. The gating circuit is configured to connect each first pixel circuit to at least two light-emitting devices in a time-division manner to drive the light-emitting devices connected to the first pixel circuit to emit light.

19 Claims, 25 Drawing Sheets

(52) U.S. Cl.
CPC ............... *G09G 2300/0819* (2013.01); *G09G 2300/0842* (2013.01); *G09G 2310/0286* (2013.01); *G09G 2310/08* (2013.01); *G09G 2320/0686* (2013.01)

(58) Field of Classification Search
USPC ........................................................ 345/690
See application file for complete search history.

(56) References Cited

U.S. PATENT DOCUMENTS

| | | | |
|---|---|---|---|
| 2018/0151663 A1* | 5/2018 | Kim | .................. H10K 59/1315 |
| 2020/0243003 A1 | 7/2020 | Yang et al. | |
| 2021/0134925 A1* | 5/2021 | Choi | .................... H10K 59/131 |
| 2021/0217821 A1 | 7/2021 | Han et al. | |
| 2021/0264848 A1* | 8/2021 | Yamashita | ........... G09G 3/2011 |
| 2021/0265430 A1 | 8/2021 | Chang et al. | |
| 2021/0319748 A1 | 10/2021 | Chen et al. | |
| 2022/0045151 A1* | 2/2022 | Jeong | ................... H10K 59/124 |
| 2022/0190051 A1 | 6/2022 | Lou et al. | |
| 2022/0285468 A1* | 9/2022 | Jeong | ................. H10K 59/1213 |
| 2023/0024029 A1 | 1/2023 | Yu et al. | |
| 2023/0028604 A1 | 1/2023 | Ma et al. | |

FOREIGN PATENT DOCUMENTS

| | | |
|---|---|---|
| CN | 109584794 A | 4/2019 |
| CN | 110189706 A | 8/2019 |
| CN | 110232892 A | 9/2019 |
| CN | 110379366 A | 10/2019 |
| CN | 110767710 A | 2/2020 |
| CN | 111180483 A | 5/2020 |
| CN | 111180494 A | 5/2020 |
| CN | 111354309 A | 6/2020 |
| CN | 111430434 A | 7/2020 |
| CN | 111430436 A | 7/2020 |
| CN | 111462686 A | 7/2020 |
| CN | 111564120 A | 8/2020 |
| JP | 2020-118952 A | 8/2020 |
| KR | 10-2014-0140291 A | 12/2014 |

* cited by examiner

DISPLAY PANEL AND METHOD FOR DRIVING THE SAME, AND DISPLAY APPARATUS

CROSS-REFERENCE TO RELATED APPLICATIONS

This application is a national phase entry under 35 USC 371 of International Patent Application No. PCT/CN2021/110964, filed on Aug. 5, 2021, which claims priority to Chinese Patent Application No. 202010990185.0, filed on Sep. 18, 2020, which are incorporated herein by reference in their entirety.

TECHNICAL FIELD

The present disclosure relates to the field of display technologies, and in particular, to a display panel and a method for driving the same, and a display apparatus.

BACKGROUND

With the advent of the "full screen" era, a high screen-to-body ratio has become a new development trend for electronic devices such as mobile phones and notebook computers. The screen-to-body ratio refers to a ratio of a screen area of a display screen to an area of an entire front face of the display screen. The display screen is designed to be a special-shaped display screen with a notch region, such as a bang screen or a water drop screen. The notch region may be used to arrange a sensor of the display screen, such as a camera or a light sensor, so as to improve the screen-to-body ratio of the screen. However, the special-shaped display screen is not a true "full screen", and display cannot be realized in the notch region of the display screen, thereby reducing the screen-to-body ratio.

In the related art, by providing the sensor under the display screen, e.g., by placing the camera under the display screen, both a sensing function and display may be realized in a region of the display screen above the sensor, thereby improving the screen-to-body ratio.

SUMMARY

In an aspect, a display panel is provided. The display panel has a first display region, a second display region, a first peripheral region and a second peripheral region. The first peripheral region is located outside the first display region, and the second peripheral region is located outside the second display region. A transmittance of the first display region is greater than a transmittance of the second display region. The display panel includes a substrate, a plurality of light-emitting devices, a plurality of first pixel circuits and a gating circuit. The plurality of light-emitting devices are disposed on the substrate and located in the first display region. The plurality of first pixel circuits are disposed on the substrate and located in the first peripheral region. The gating circuit is disposed on the substrate and coupled to the plurality of light-emitting devices and the plurality of first pixel circuits. The gating circuit is configured to connect each first pixel circuit to at least two light-emitting devices in a time-division manner, so as to drive the light-emitting devices connected to the first pixel circuit to emit light.

In some embodiments, the gating circuit includes a plurality of control signal lines, a plurality of driving signal lines, and a plurality of transistors. The plurality of driving signal lines are coupled to the plurality of first pixel circuits. A control electrode of each transistor is coupled to a control signal line, a first electrode of the transistor is coupled to a driving signal line, and a second electrode of the transistor is coupled to a light-emitting device.

In some embodiments, the plurality of driving signal lines are arranged in a same layer. The plurality of driving signal lines are transparent.

In some embodiments, the plurality of light-emitting devices are divided into first light-emitting device columns and second light-emitting device columns, and the first light-emitting device columns and the second light-emitting device columns are sequentially arranged at intervals. Transistors coupled to light-emitting devices in a row in the first light-emitting device columns and transistors coupled to light-emitting devices in a corresponding row in the second light-emitting device columns are coupled to a same control signal line. Two transistors coupled to adjacent two light-emitting devices in each of the first light-emitting device columns and the second light-emitting device columns light-emitting device column are coupled to different first pixel circuits through different driving signal lines.

In some embodiments, transistors coupled to each of the first light-emitting device columns and the second light-emitting device columns are coupled to a column of first pixel circuits, and the column of first pixel circuits includes N first pixel circuits, N being an integer greater than 1. Transistors coupled to light-emitting devices continuously distributed in every N rows in a first light-emitting device column or a second light-emitting device column are respectively coupled to the N first pixel circuits in the column of first pixel circuits in sequence.

In some embodiments, the column of first pixel circuits includes two first pixel circuits, for the first light-emitting device column or the second light-emitting device column coupled to the column of first pixel circuits, transistors coupled to light-emitting devices in odd-numbered rows are coupled to one first pixel circuit of the two first pixel circuits, and transistors coupled to light-emitting devices in even-numbered rows are coupled to another first pixel circuit of the two first pixel circuits.

In some embodiments, transistors coupled to a same first pixel circuit are coupled to a same driving signal line.

In some embodiments, the plurality of transistors are located on a side of the plurality of light-emitting devices proximate to the substrate. An orthographic projection of at least one transistor on the substrate overlaps with orthographic projections of the plurality of light-emitting devices on the substrate.

In some embodiments, an orthographic projection of each light-emitting device on the substrate overlaps with an orthographic projection of a transistor coupled to each light-emitting device on the substrate.

In some embodiments, transistors coupled to a column of light-emitting devices are divided into a plurality of transistor groups, and each transistor group includes at least two transistors. In a column direction in which the plurality of light-emitting devices are arranged, light-emitting devices coupled to the at least two transistors are distributed continuously, and adjacent two transistor groups are separated by at least one light-emitting device.

In some embodiments, the plurality of control signal lines are divided into a plurality of control signal line groups. Each control signal line group includes at least two control signal lines. In a column direction in which the plurality of light-emitting devices are arranged, light-emitting devices coupled to the at least two control signal lines in a column of light-emitting devices are distributed continuously, and adjacent two control signal line groups are separated by at least one light-emitting device. A spacing between the at least two control signal lines in the control signal line group is less than a spacing between adjacent two light-emitting devices.

In some embodiments, the display panel further includes at least one first driving circuit and at least one second driving circuit. The at least one first driving circuit is disposed in the first peripheral region. The at least one second driving circuit is disposed in the first peripheral region. The at least one first driving circuit includes a plurality of first shift register circuits connected in cascade, and a first shift register circuit is coupled to a control signal line. Each second driving circuit includes a plurality of second shift register circuits connected in cascade, and a second shift register circuit is coupled to a row of first pixel circuits.

In some embodiments, in a column direction in which the plurality of light-emitting devices are arranged, the at least one first driving circuit is located on a side of two opposite sides of the first display region proximate to an edge of the display panel.

In some embodiments, the at least one first driving circuit includes first driving circuits, and the first driving circuits are located on two opposite sides of the first display region in a direction perpendicular to a column direction in which the plurality of light-emitting devices are arranged. Or, the at least one first driving circuit is located on one of the two opposite sides of the first display region in the direction perpendicular to the column direction in which the plurality of light-emitting devices are arranged.

In some embodiments, the at least one second driving circuit includes second driving circuits, and the second driving circuits are located on two opposite sides of the first display region in a direction perpendicular to a column direction in which the plurality of light-emitting devices are arranged. Or, the at least one second driving circuit is located on one of the two opposite sides of the first display region in the direction perpendicular to the column direction in which the plurality of light-emitting devices are arranged.

In some embodiments, the display panel further includes a plurality of first data lines, a plurality of second pixel circuits, and a plurality of second data lines. The plurality of first data lines are disposed on the substrate, and the plurality of first data lines are coupled to the plurality of first pixel circuits. The plurality of second pixel circuits are disposed on the substrate and located in the second display region. The plurality of second data lines are disposed on the substrate. The plurality of second data lines are coupled to the plurality of second pixel circuits.

In some embodiments, in a column direction in which the plurality of light-emitting devices are arranged, the plurality of first pixel circuits are located on a side of two opposite sides of the first display region away from an edge of the display panel. The plurality of first data lines and the plurality of second data lines extend in a same direction, and orthographic projections of the plurality of first data lines on the substrate overlap with the second display region.

In some embodiments, in a column direction in which the plurality of light-emitting devices are arranged, the plurality of first pixel circuits are located on a side of two opposite sides of the first display region proximate to an edge of the display panel. Orthographic projections of the plurality of first data lines on the substrate do not overlap with the second display region. The plurality of first data lines and the plurality of second data lines are arranged in a same layer.

In another aspect, a display apparatus is provided. The display apparatus includes the display panel as described in any one of the above embodiments and a driver chip. The driver chip is coupled to the display panel. The driver chip is configured to provide control signals to the gating circuit in the display panel, and provide data signals to the plurality of first pixel circuits in the display panel.

In yet another aspect, a method for driving a display panel is provided. The display panel is the display panel as described in any one of the above embodiments. The method includes: outputting at least two data signals to a first pixel circuit sequentially, the at least two data signals being configured to drive at least two light-emitting devices coupled to the first pixel circuit; and outputting at least two control signals to the gating circuit sequentially, so that the at least two light-emitting devices coupled to the first pixel circuit are turned on to form conductive paths in a time-division manner, and each light-emitting device is driven to emit light by a driving current corresponding to a data signal for driving the light-emitting device.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Figure 1:
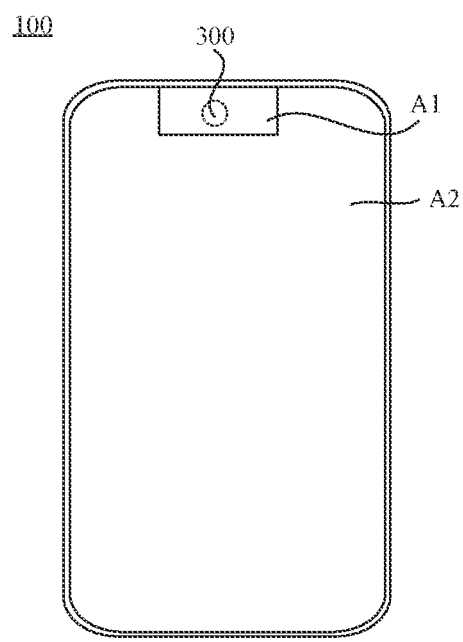
FIG. 1 is a structural diagram of a display panel, in accordance with some embodiments.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art on a basis of the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive meaning, i.e., "including, but not limited to". In the description of the specification, the term such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above term do not necessarily refer to the same embodiment(s) or examples(s). In addition, specific features, structures, materials or characteristics may be included in any one or more embodiments or examples in any suitable manner.

Hereinafter, the terms "first" and "second" are only used for descriptive purposes, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "multiple", "a plurality of" or "the plurality of" means two or more unless otherwise specified.

In the description of some embodiments, the term "coupled", "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The use of the phrase "applicable to" or "configured to" herein indicates an open and inclusive expression, which does not exclude devices that are applicable to or configured to perform additional tasks or steps.

The term such as "about" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

The terms indicating orientations or positional relationships such as "upper/above", "lower/below", "row/row direction", "column/column direction", and the like are based on orientations or positional relationships shown in the drawings, which are merely simplified descriptions used to facilitate the description of technical solutions in the present disclosure, and are not to indicate or imply that the devices or elements referred to must have a particular orientation, or must be constructed or operated in a particular orientation. Therefore, they should not be construed as limitations on the present disclosure. For example, in some cases, embodiments involving "row direction" may be implemented in the case of "column direction", and so on, and vice versa. It is also within the scope of the claims to be protected by the present disclosure to rotate or mirror the solutions described in the present disclosure by 90°.

Exemplary embodiments are described herein with reference to sectional views and/or plan views as idealized exemplary drawings. In the accompanying drawings, thicknesses and regions of layers are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

Embodiments of the present disclosure provide a display panel. For example, the display panel may be a light-emitting diode (LED) display panel, or an organic light-emitting diode (OLED) display panel.

Figure 2:
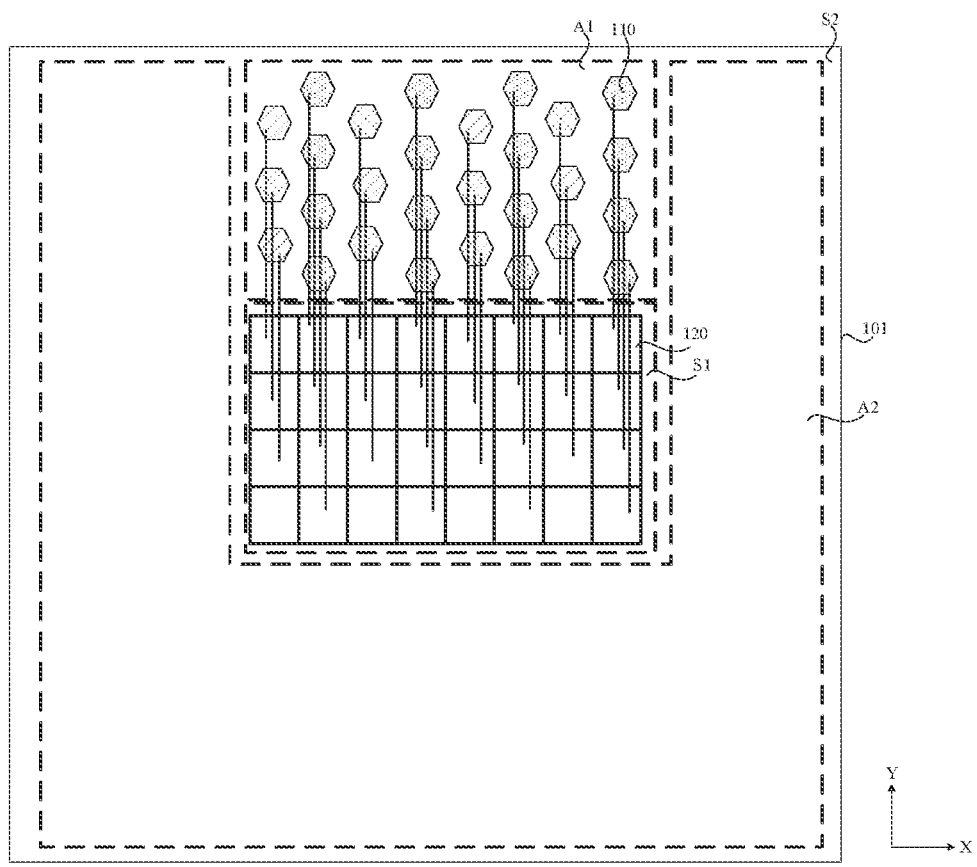
FIG. 2 is a structural diagram of another display panel, in accordance with some embodiments.

As shown in FIG. 2, the display panel 100 has a first display region A1, a second display region A2, a first peripheral region S1 and a second peripheral region S2. For example, the second display region A2 may be located on at least one side of the first display region A1. For example, the second display region A2 may surround the first display region A1; alternatively, in a case where the first display region A1 has a quadrilateral shape, the second display region A2 may be located outside three continuously distributed borders of the first display region A1. As shown in FIG. 2, the first peripheral region S1 is located outside first display region A1, and the second peripheral region S2 is located outside the second display region A2. For example, the first peripheral region S1 is located on at least one side of the first display region A1; and the second peripheral region S2 is located on at least one side of the second display region A2. For example, the first peripheral region S1 may be located between the first display region A1 and the second display region A2. For another example, the first peripheral region S1 may overlap with the second peripheral region S2. For example, the first peripheral region S1 may be located within the second peripheral region S2.

It will be noted that, shapes of the first display region A1 and the second display region A2 are not limited in the embodiments of the present disclosure, which may be set according to actual situations. For example, the first display region A1 and the second display region A2 both have a rectangular shape (or a shape of a rounded rectangle). In this case, an edge of the second display region A2 may have a depression portion (a depression direction is a direction pointing from an edge to a center of the display panel 100), and the first display region A1 is located in a region where the depression portion is located. For example, an area of the first display region A1 is less than or equal to an area of the second region A2.

In some embodiments, as shown in FIG. 1, a sensor 300 (e.g., a camera or a light sensor) is arranged below a portion of the display panel 100 in the first display region A1, so that a screen-to-body ratio may be increased. In addition, in order to make the sensor disposed below the display panel 100 realize a sensing function, a transmittance of a region (the first display region A1) where the sensor is located is high. For example, the transmittance of the first display region A1 is greater than a transmittance of the second display region A2.

In the related art, the first display region A1 and the second display region A2 are each provided with pixels therein. An arrangement density of the pixels in the first display region A1 is less than an arrangement density of the pixels in the second display region A2, so that a resolution of the first display region A1 (e.g., 200 pixels per inch (PPI)) is less than a resolution of the second display region A2 (e.g., 400 PPI). In this way, although the transmittance of the first display region A1 may be improved by reducing the resolution of the first display region A1, images displayed in the first display region A1 may have low image quality, and the display effect may be reduced.

As shown in FIG. 2, the display panel 100 provided in the embodiments of the present disclosure includes a substrate 101, a plurality of light-emitting devices 110 and a plurality of first pixel circuits 120. The plurality of light-emitting devices 110 are disposed on the substrate 101 and located in the first display region A1. The plurality of first pixel circuits 120 are disposed on the substrate 101 and located in the first peripheral region S1.

For example, the substrate 101 may include a rigid base (or referred to as a hard base) such as glass, or a flexible substrate such as polyimide (PI). The substrate 101 may further include a film such as a buffer layer disposed on the rigid base or the flexible base. The light-emitting device 110 may be a LED or an OLED.

It will be noted that, a specific structure of the first pixel circuit 120 is not limited in the embodiments of the present disclosure, which may be designed according to actual situations. For example, the first pixel circuit 120 is composed of electronic devices such as a thin film transistor (TFT) and a capacitors (C). For example, the first pixel circuit 120 may be a pixel circuit with a 2T1C structure composed of two thin film transistors (a switching transistor and a driving transistor) and one capacitor. Of course, the first pixel circuit 120 may also be a pixel circuit composed of more than two thin films transistors (a plurality of switching transistors and one driving transistor) and at least one capacitor. For example, referring to FIG. 5, the first pixel circuit 120 may be a pixel circuit with a 7T1C structure composed of one storage capacitor Cst and seven transistors (six switching transistors (M1, M2, M3, M5, M6 and M7) and one driving transistor M4).

In addition, in a case where the light-emitting device 110 is an OLED, the light-emitting device 110 includes a cathode, an anode, and a light-emitting functional layer located between the cathode and the anode. The light-emitting functional layer may include, for example, an organic light-emitting layer, a hole transport layer located between the organic light-emitting layer and the anode, and an electron transport layer located between the organic light-emitting layer and the cathode. Of course, according to needs, in some embodiments, a hole injection layer may be provided between the hole transport layer and the anode, and an electron injection layer may be provided between the electron transport layer and the cathode. It will be noted that, for convenience of description, in the embodiments of the present disclosure, only the anode of the light-emitting device 110 is illustrated in the figures, and the actual structure of the light-emitting device 110 is different from the structure of the anode.

It can be understood that, the light-emitting devices 110 and the plurality of first pixel circuits 120 are not in the same region. The plurality of first pixel circuits 120 may be located on at least one side of the first display region A1. For example, the plurality of first pixel circuits 120 are located in a region between the second display region A2 and the first display region A1, so that the plurality of first pixel circuits 120 do not block light of the first display region A1, which may improve the transmittance of the first display region A1. In this case, the arrangement density of the pixels in the first display region A1 may be increased. That is, the resolution of the first display region A1 may be increased. For example, the resolution of the first display region A1 may be increased from 200 PPI to 400 PPI. As a result, the resolution of the first display region A1 is equal to the resolution of the second display region A2.

Moreover, in a case where the resolution of the first display region A1 is equal to the resolution of the second display region A2, an arrangement density of light-emitting devices located in the first display region A1 is equal to an arrangement density of light-emitting devices located in the second display region A2, and an arrangement density of pixel circuits (the first pixel circuits 120) in the first display region A1 is equal to an arrangement density of pixel circuits (e.g., second pixel circuits 170 described below) in the second display region A2. Therefore, compared with a case in which the first pixel circuits 120 are disposed in the first display region A1, in the embodiments of the present disclosure, it may prevent the plurality of first pixel circuits 120 from blocking the light, improve the transmittance of the first display region A1, and ensure that an under-screen sensing (e.g., an under-screen camera) of the display panel 100 is realized.

For example, an average light-emitting area of light-emitting devices per unit area in the first display region A1 may be equal to an average light-emitting area of light-emitting devices per unit area in the second display region A2. Alternatively, the average light-emitting area of the light-emitting devices per unit area in the first display region A1 may be less than the average light-emitting area of the light-emitting devices per unit area in the second display region A2. Therefore, it avoids the diffraction due to the light being blocked by the light-emitting devices during a photographing process of the under-screen camera.

Figure 3:
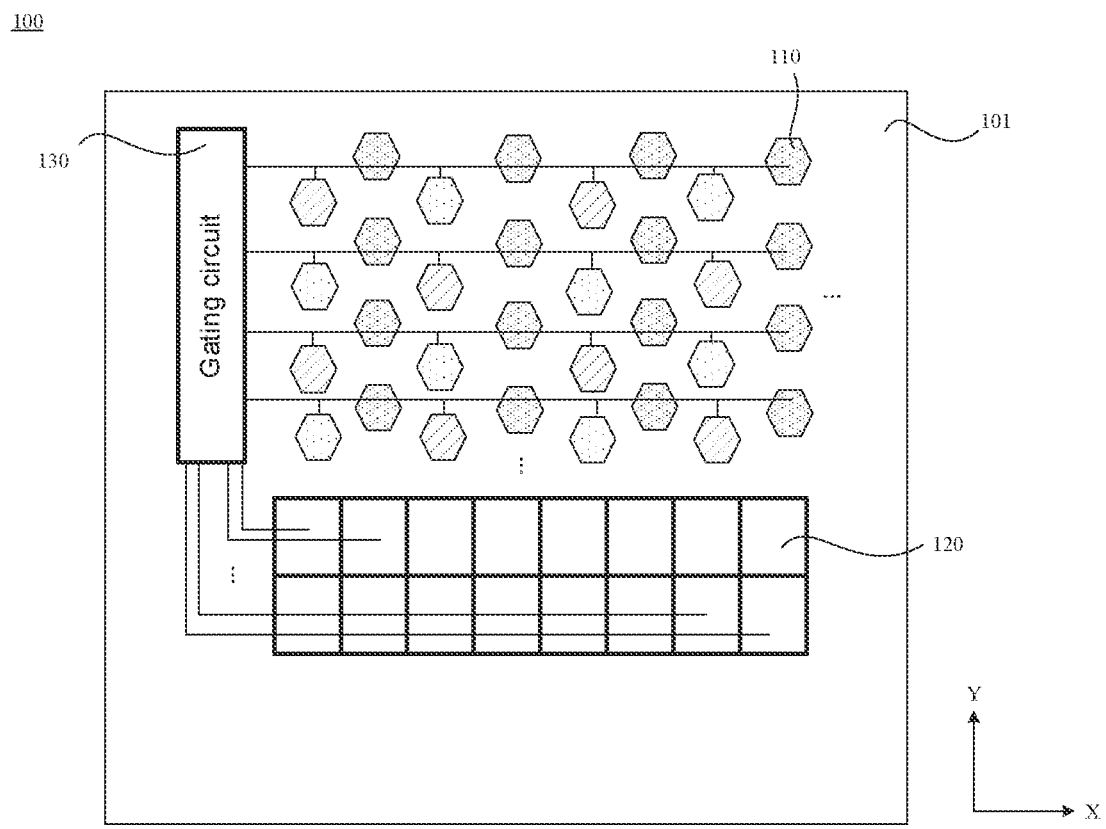
FIG. 3 is a structural diagram of yet another display panel, in accordance with some embodiments.

As shown in FIG. 3, the display panel 100 further includes a gating circuit 130. The gating circuit 130 is disposed on the substrate 101. The gating circuit 130 is coupled to the plurality of light-emitting devices 110 and the plurality of first pixel circuits 120. The gating circuit 130 is configured to connect each first pixel circuit 120 to at least two light-emitting devices 110 in a time-division manner, so as to drive the light-emitting devices 110 connected to the first pixel circuit 120 to emit light.

It can be understood that, a first pixel circuit 120 is coupled to at least two light-emitting devices 110 through the gating circuit 130. The first pixel circuit 120 may drive the at least two light-emitting devices 110 to operate (emit light) through the gating circuit 130 in a time-division manner. For example, in a case where a first pixel circuit 120 is coupled to multiple light-emitting devices 110, the first pixel circuit 120 causes one light-emitting device 110 to be turned on at a time through the gating circuit 130; or, the first pixel circuit 120 causes at least two light-emitting devices 110 to be turned on at a time through the gating circuit 130.

In this case, compared with a situation where the first pixel circuits 120 are coupled to the light-emitting devices 110 in one-to-one correspondence, in the embodiments of the present disclosure, each first pixel circuit 120 is coupled to at least two light-emitting devices 110 through the gating circuit 130, which may reduce the number of first pixel circuits 120, reduce an area of a region where the first pixel circuits 120 are located, reduce an area of the first peripheral region S1, and in turn facilitate a narrow bezel. In addition, in a case where the first pixel circuits 120 are located between the first display region A1 and the second display region A2, an area of a portion of the first peripheral region S1 located between the first display region A1 and the second display region A2 may be reduced, thereby improving the display effect of the display panel 100.

Therefore, in the display panel 100 provided in the embodiments of the present disclosure, the plurality of light-emitting devices 110 are located in the first display region A1, the plurality of first pixel circuits 120 are located in the first peripheral region S1, and each first pixel circuit 120 is connected to at least two light-emitting devices 110 in a time-division manner through the gating circuit 130 to drive the light-emitting devices 110 connected to the first pixel circuit 120 to emit light. In this case, since the plurality of first pixel circuits 120 are not disposed in the first display region A1, the plurality of first pixel circuits 120 will not block the light of the first display region A1, which may improve the transmittance of the first display region A1, and the resolution of the first display region A1 may be improved (the resolution of the first display region A1 is same as that of the second display region A2), so that the display effect of the display panel 100 is improved. In addition, each first pixel circuit 120 is coupled to at least two light-emitting devices 110 through the gating circuit 130, which may reduce the number of first pixel circuits 120, and reduce the area of the region where the first pixel circuits 120 are located, so as to facilitate the narrow bezel of the display panel 100.

Figure 4:
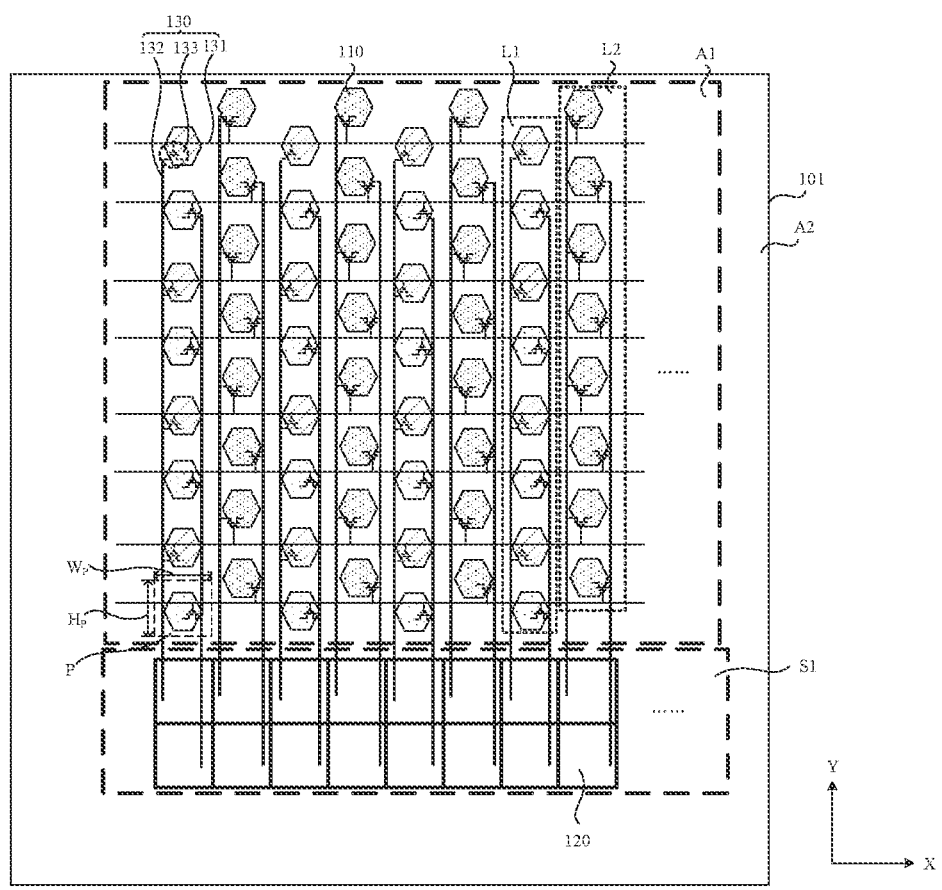
FIG. 4 is a structural diagram of yet another display panel, in accordance with some embodiments.

In some embodiments, as shown in FIG. 4, the gating circuit 130 includes a plurality of control signal lines 131, a plurality of driving signal lines 132 and a plurality of transistors 133. The plurality of driving signal lines 132 are coupled to the plurality of first pixel circuits 120. A control electrode of each transistor 133 is coupled to a control signal line 131, a first electrode of the transistor 133 is coupled to a driving signal line 132, and a second electrode of the transistor 133 is coupled to a light-emitting device 110.

The plurality of control signal lines 131 intersect the plurality of driving signal lines 132, and the plurality of control signal lines 131 are closer to the substrate 101 than the plurality of driving signal lines 132. The second electrode of the transistor 133 is coupled to the anode of the light-emitting device 110.

For example, the driving signal lines 132 are transparent. In this way, in a case where portions of the driving signal lines 132 located in the first display region A1, the transmittance of the first display region A1 may not be affected. For example, a material of the control signal lines 131 may be the same as a material of the control electrodes of the transistors 133, and the control signal lines 131 and the control electrodes of the transistors 133 may be formed at the same time. The material of the control signal lines 131 may include metal, such as molybdenum (Mo). Alternatively, the control signal lines 131 may also be transparent. For example, the material of the control signal lines 131 and a material of the driving signal lines 132 may each include a transparent conductive material, such as indium tin oxide (ITO).

It will be noted that, the transistor 133 may be a TFT, a field effect transistor (FET) or other switching devices with the same characteristics, which is not limited in the embodiments of the present disclosure. In addition, the control electrode of each transistor described herein is a gate of the transistor, the first electrode of the transistor is one of a source and a drain of the transistor, and the second electrode of the transistor is the other one of the source and the drain of the transistor. Since a source and a drain of a transistor may be symmetrical in structure, the source and the drain of the transistor may be the same in structure. That is, the first electrode and the second electrode of the transistor in the embodiments of the present disclosure may be the same in structure. For example, in a case where the transistor is a P-type transistor, the first electrode of the transistor is a source, and the second electrode of the transistor is a drain. For example, in a case where the transistor is an N-type transistor, the first electrode of the transistor is a drain, and the second electrode of the transistor is a source.

It can be understood that, in the gating circuit 130, the plurality of control signal lines 131 transmit control signals to the transistors 133 coupled to the plurality of control signal lines 131 to turn on the transistors 133. Transistors 133 coupled to the same control signal line 131 are turned on at the same time, and transistors 133 coupled to different control signal lines 131 are turned on in a time-division manner. In a case where a transistor 133 is turned on, a first pixel circuit 120 coupled to the transistor 133 transmits a driving signal to a light-emitting device 110 coupled to the transistor 133 through a driving signal line 132, so as to drive the light-emitting device 110 to operate.

The resolution of the display panel 100 may reach a full high definition (FHD) resolution. That is, the display panel 100 may display a FHD image. In the display panel with the FHD resolution, referring to FIG. 4, a width WP of a sub-pixel region P (e.g., referring to a dimension of the sub-pixel region P in a horizontal direction X in FIG. 4) is about 32 μm, and a height HP of the sub-pixel region P (e.g., referring to a dimension of the sub-pixel region P in a vertical direction Y in FIG. 4) is about 64 μm. It will be noted that, for convenience of representation, a position of the sub-pixel region P is represented by a position of the light-emitting device 110 shown in the figures, but the position of the sub-pixel region P and the position of the light-emitting device 110 are not completely the same in practice.

Figure 6:
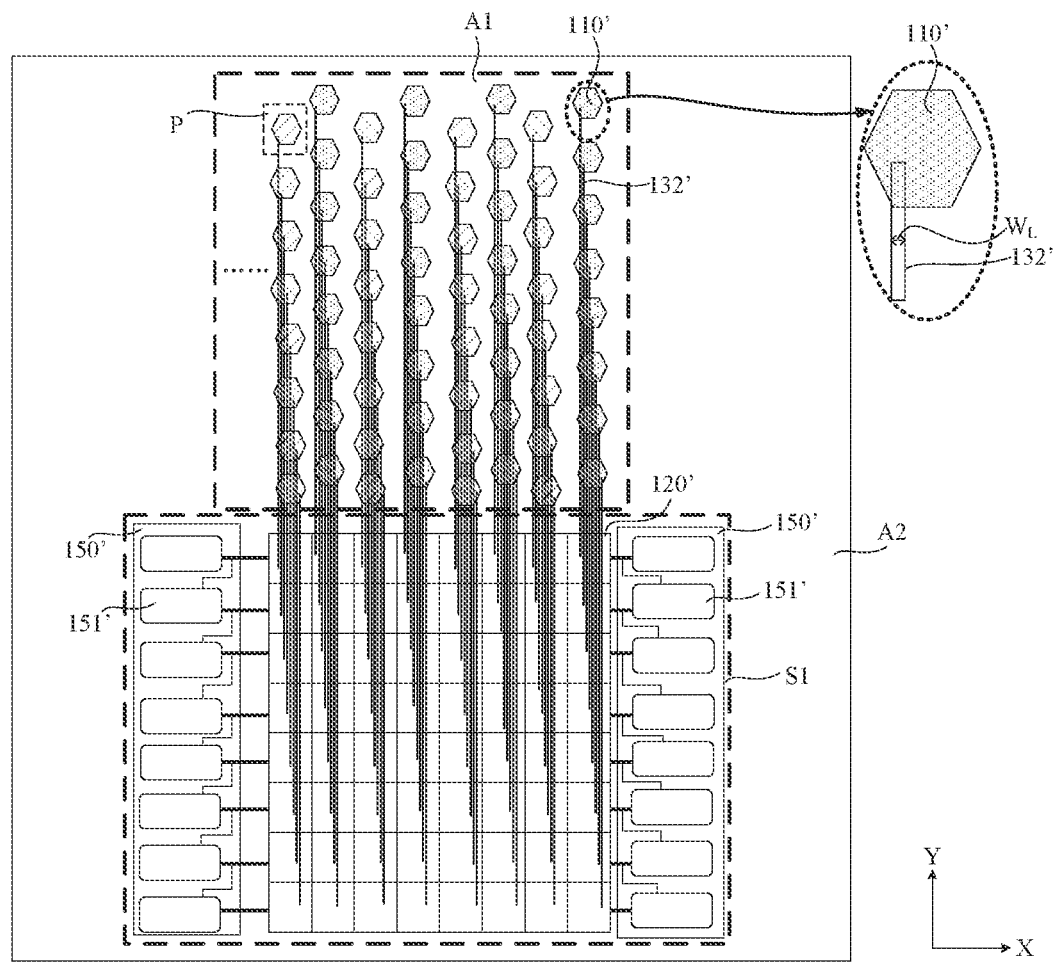
FIG. 6 is a structural diagram of yet another display panel, in accordance with some embodiments.

For example, in the display panel 100' shown in FIG. 6, a single light-emitting device 110' is coupled to a single first pixel circuit 120' through a single driving signal line 132'. Referring to FIG. 6, a width WL of the driving signal line 132' (e.g., referring to a dimension of the driving signal line 132' in the horizontal direction X in FIG. 6) is about 4 μm. In this case, in the FHD display panel, if driving signal lines 132' are arranged in a single layer, in a column of sub-pixel regions, there may be eight (a quotient of 32 μm and 4 μm) driving signal lines 132' arranged in the horizontal direction X. In the vertical direction Y, a column of sub-pixel regions may include eight sub-pixel regions, and a column of light-emitting devices may include eight light-emitting devices. In this case, a dimension of the first display region A1 in the vertical direction Y is 0.512 mm (i.e., a product of 8 μm and 64 μm). If the driving signal lines 132' are arranged in two layers, in a column of sub-pixel regions, there may be sixteen driving signal lines 132' arranged in the horizontal direction X. In the vertical direction Y, a column of sub-pixel regions may include sixteen sub-pixel regions, and a column of light-emitting devices may include sixteen light-emitting devices. In this case, the dimension of the first display region A1 in the vertical direction Y is 1.024 mm (i.e., a product of 16 μm and 64 μm). If the driving signal lines 132' are arranged in three layers, in a column of sub-pixel regions, there may be twenty-four driving signal lines 132' arranged in the horizontal direction X (for example, the driving signal lines 132' in the first display region A1 may be routed on double sides). In the vertical direction Y, a column of sub-pixel regions may include twenty-four sub-pixel regions, and a column of light-emitting devices may include twenty-four light-emitting devices. In this case, the dimension of the first display region A1 in the vertical direction Y is 1.536 mm (i.e., a product of 24 μm and 64 μm).

On this basis, since an aperture of an under-screen camera is greater than 3 mm, at least three layers of driving signal lines 132' are required to make the first display region A1 have enough space for arranging the camera. In this case, in the process, a planarization layer (PLN) with via holes is formed on the substrate 101 by using a mask, a transparent conductive film is formed on the planarization layer, and the mask is used to pattern the transparent conductive film is patterned by using another mask, so as to form a first layer of driving signal lines 132'; another planarization layer with via holes is formed on the first layer of driving signal lines 132' by using yet another mask, another transparent conductive film is formed on the another planarization layer, and the another transparent conductive film is patterned by using yet another mask, so as to form a second layer of driving signal lines 132'; yet another planarization layer with via holes is formed on the second layer of driving signal lines 132' by using yet another mask, and yet another transparent conductive film is formed on the planarization layer, and the yet another transparent conductive film is patterned by using yet another mask, so as to form a third layer of driving signal lines 132'. Therefore, in the process of forming the three layers of driving signal lines 132', six masks are required to pattern six films. As a result, the manufacturing process of the display panel 100 is complicated, and the production cost is large, which easily leads to a large loss of production capability of the display panel.

It can be understood that, since the first pixel circuit 120 in the display panel 100 may form conductive paths with at least two light-emitting devices 110 through the gating circuit 130 in a time-division manner, a single first pixel circuit 120 may be coupled to at least two transistors 133 through a single driving signal line 132. That is, a single first pixel circuit 120 is coupled to at least two light-emitting devices 110 through a single driving signal line 132. The at least two transistors 133 are turned on in a time-division manner through different control signal lines 131, and form conductive paths with the first pixel circuit 120, so that the first pixel circuit 120 drives the at least two light-emitting devices 110 in a time-division manner. Therefore, compared with a situation where a single light-emitting device is coupled to a single first pixel circuit through a single driving signal line, in the embodiments of the present disclosure, the number of driving signal lines 132 is reduced, and there is a large space in the first display region A1 for the wiring of the plurality of driving signal lines 132. As a result, it is possible to avoid a complicated process, a large production cost and a large loss of the production capability of the display panel due to a multi-layer arrangement of the plurality of driving signal lines 132.

In some embodiments, the plurality of driving signal lines 132 are arranged in the same layer. For example, the plurality of driving signal lines 132 are formed by patterning the same film, thereby simplifying the production process and reducing the production cost.

In some embodiments, as shown in FIG. 4, the plurality of light-emitting devices 110 are divided into first light-emitting device columns L1 and second light-emitting device columns L2, and the first light-emitting device columns L1 and the second light-emitting device columns L2 are sequentially arranged at intervals. For example, in the horizontal direction X in FIG. 4, a second light-emitting device column L2 is disposed between adjacent two first light-emitting device columns L1. For example, a first light-emitting device column L1 and a second light-emitting device column L2 that are adjacent are staggered. That is, in a direction perpendicular to a column direction in which the light-emitting devices 110 are arranged (e.g., referring to the horizontal direction X in FIG. 11), a light-emitting device 110 in each row in the first light-emitting device column L1 and a light-emitting device 110 in a corresponding row in the second light-emitting device column L2 are arranged in a staggered manner. For example, referring to FIG. 11, in adjacent two first light-emitting device columns L1, geometric centers of four first light-emitting devices 110 (two light-emitting devices 110 in two adjacent rows in one first light-emitting device column L1 and two light-emitting devices 110 in two corresponding rows in the other first light-emitting device column L1) are sequentially connected to constitute a quadrilateral Q. In this case, a geometric center of a light-emitting device 110 in a second light-emitting device column L2 between the two first light-emitting device columns L1 coincides with an intersection point of two diagonals of the quadrilateral Q.

Transistors 133 coupled to light-emitting devices in a row in the first light-emitting device columns L1 and transistors 133 coupled to light-emitting devices 110 in a corresponding row in the second light-emitting device columns L2 are coupled to a same control signal line 111. Two transistors 133 coupled to adjacent two light-emitting devices 110 in each of the first light-emitting device columns L1 and the second light-emitting device columns L2 are coupled to different first pixel circuits 120 through different driving signal lines 132.

The first light-emitting device columns L1 and the second light-emitting device columns L2 extend in a same direction. In the direction perpendicular to the column direction in which the light-emitting devices are arranged, the first light-emitting device columns L1 and the second light-emitting device columns L2 are sequentially arranged at intervals. A single second light-emitting device column is located between adjacent two first light-emitting device columns.

It will be noted that, the light-emitting device 110 in the corresponding row in the second light-emitting device column L2 refers to a light-emitting device in the second light-emitting device column L2 that is located in a same-numbered row as the light-emitting device in the row in the first light-emitting device column L1. For example, for a light-emitting device in a first row in the first light-emitting device column L1, a light-emitting device in a corresponding row in the second light-emitting device column L2 is a light-emitting device in a first row in the second light-emitting device column L2. A row of light-emitting devices is composed of light-emitting devices in all light-emitting device columns that are located in a same-numbered row. For example, light-emitting devices in a first row (i.e., first light-emitting devices) in all first light-emitting device columns L1 and light-emitting devices in a corresponding row (i.e., first row of light-emitting devices) in all second light-emitting device columns L2 constitute a row of light-emitting devices (i.e., a first row of light-emitting devices).

It can be understood that, transistors 133 coupled to light-emitting devices in a row are controlled by a control signal line 131, so that the light-emitting devices in the row may each form a conductive path with respective first pixel circuits 120 coupled thereto. In a case where the first pixel circuits 120 coupled to the light-emitting devices in the row output driving signals, the light-emitting devices in the row may be driven to emit light synchronously. In this case, the light-emitting devices 110 in the first display region A1 may be lit up row by row. In addition, light-emitting devices 110 in adjacent two rows (i.e., adjacent two light-emitting devices 110) in each column of light-emitting devices are driven to emit light by different first pixel circuits 120. According to the actual light-emitting situations, driving manners of different first pixel circuits 120 may be selected. For example, different first pixel circuits coupled to light-emitting devices in adjacent two rows may drive the light-emitting devices in the adjacent two rows to emit light at the same time. Alternatively, different first pixels circuits coupled to light-emitting devices in adjacent two rows may drive the light-emitting devices in the adjacent two rows to emit light in a time-division manner.

In some embodiments, as shown in FIG. 4, transistors 133 coupled to light-emitting devices 110 in each column (i.e., each of the first light-emitting device columns L1 and the second light-emitting device columns L2) are coupled to a column of first pixel circuits 120. The column of first pixel circuits 120 includes N first pixel circuits 120, N being an integer greater than 1. Transistors 133 coupled to light-emitting devices 110 continuously distributed in every N rows in a column of light-emitting devices 110 (i.e., a first light-emitting device column L1 or a second light-emitting device column L2) are respectively coupled to the N first pixel circuits in the column of first pixel circuits in sequence.

It will be noted that, a column of first pixel circuits is composed of first pixel circuits 120 coupled to a column of light-emitting devices, and first pixel circuits 120 coupled to light-emitting devices in a same row constitute a row of first pixel circuits. For example, the plurality of first pixel circuits 120 are arranged in an array, first pixel circuits arranged in a line in the vertical direction Y in FIG. 4 are a column of first pixel circuits, and first pixel circuits arranged in a line in the horizontal direction X in FIG. 4 are a row of first pixel circuits.

Figure 7:
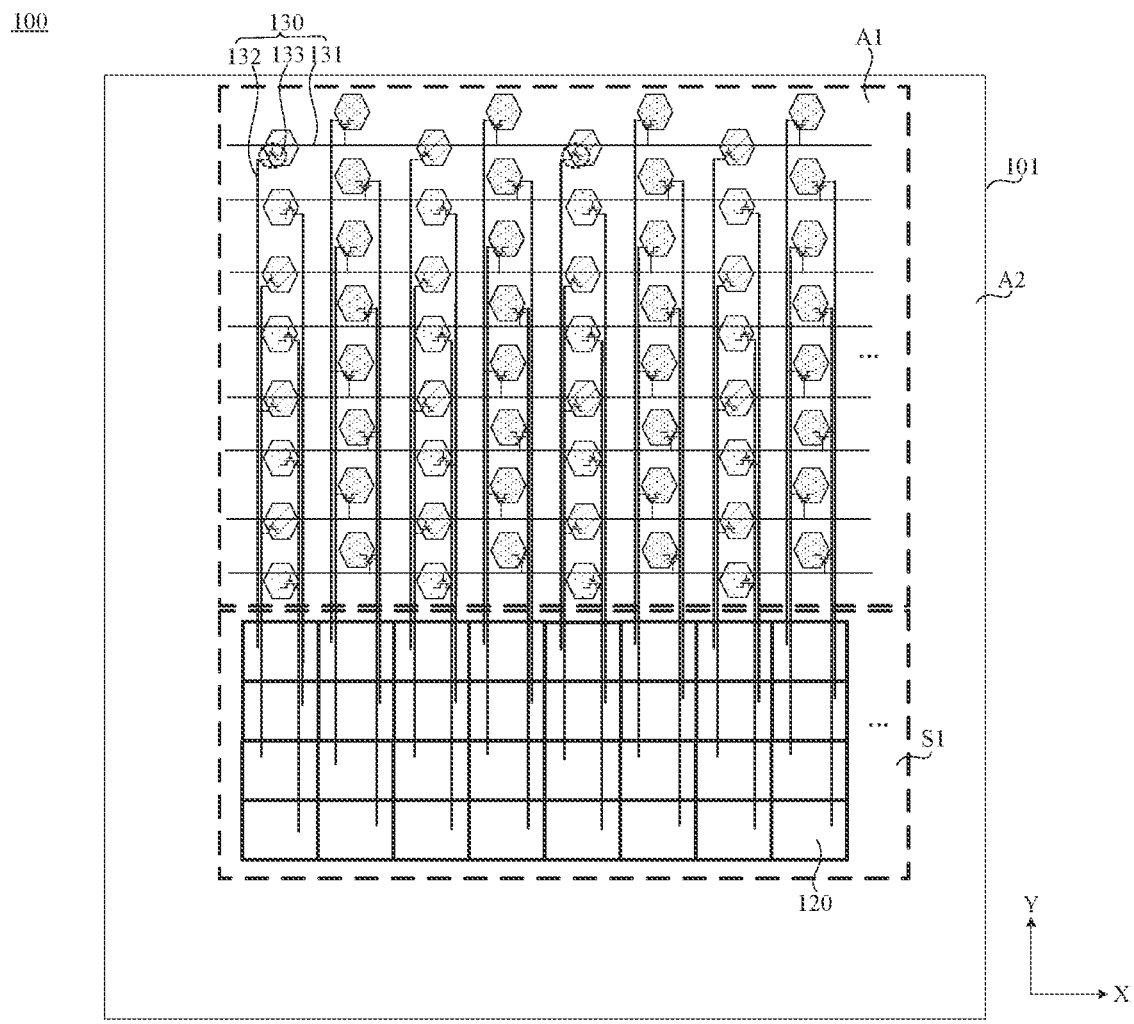
FIG. 7 is a structural diagram of yet another display panel, in accordance with some embodiments.

In addition, the number of first pixel circuits in each column of first pixel circuits may be designed according to actual situations, which is not limited herein. For example, as shown in FIG. 4, N may be 2. That is, a column of first pixel circuits includes two first pixel circuits 120. Alternatively, as shown in FIG. 7, N may be 4. That is, a column of first pixel circuits includes four first pixel circuits 120. The number of the first pixel circuits 120 in a column of first pixel circuits is less than the number of light-emitting devices 110 in a column of light-emitting devices coupled to the column of first pixel circuits.

For example, in a case where a column of first pixel circuits includes two first pixel circuits 120, referring to FIG. 4, for the column of light-emitting devices 110 coupled to the column of first pixel circuits 120, transistors 133 coupled to light-emitting devices in odd-numbered rows are coupled to one of the two first pixel circuits 120, and transistors 133 coupled to light-emitting devices in even-numbered rows are coupled to the other one of the two first pixel circuits 120.

For example, as shown in FIG. 4, a transistor coupled to a light-emitting device in a first row in a column of light-emitting devices is coupled to a first pixel circuit in a first row of the two first pixel circuits 120, and a transistor coupled to a light-emitting device in a second row in the column of light-emitting devices is coupled to a first pixel circuit in a second row of the two first pixel circuits 120. A transistor coupled to a light-emitting device in a third row in the column of light-emitting devices is coupled to the first pixel circuit in the first row of the two first pixel circuits 120, and a transistor coupled to a light-emitting device in a fourth row in the column of light-emitting devices is coupled to the first pixel circuit in the second row of the two first pixel circuits 120, and so on.

It can be understood that, the two first pixel circuits 120 operate alternately to drive the light-emitting devices 110 in a time-division manner; and in the column of light-emitting devices, when one light-emitting device 110 is driven by a first pixel circuit 120 to operate, other light-emitting devices 110 do not operate. For example, in the column of light-emitting devices 110, when the first pixel circuit in the first row drives the light-emitting device in the first row to operate, the first pixel circuit in the second row does not drive light-emitting devices coupled thereto to operate, and other light-emitting devices coupled to the first pixel circuit in the first row except for the light-emitting device in the first row do not operate, so that transistors coupled to other light-emitting devices except for the light-emitting device in the first row are not turned on. When the first pixel circuit in the second row drives the light-emitting device in the second row to operate, the first pixel circuit in the first row does not drive light-emitting devices coupled thereto to operate, and other light-emitting devices coupled to the first pixel circuit in the second row except for the light-emitting device in the second row do not operate, so that transistors coupled to other light-emitting devices except for the light-emitting device in the second row are not turned on. When the first pixel circuit in the first row drives the light-emitting device in the third row to operate, the first pixel circuit in the second row does not drive the light-emitting devices coupled thereto to operate, and other light-emitting devices coupled to the first pixel circuit in the first row except for the light-emitting device in the third row do not operate, so that transistors coupled to other light-emitting devices except for the light-emitting device in the third row are not turned on.

For example, in a case where a column of first pixel circuits includes four first pixel circuits 120, referring to FIG. 7, transistors 133 coupled to light-emitting devices 110 continuously distributed in every four rows in a column of light-emitting devices 110 (i.e., a first light-emitting device column L1 or a second light-emitting device column L2) are coupled to four first pixel circuits in a column of first pixel circuits in sequence, and the four first pixel circuits operate sequentially and periodically. For example, as shown in FIG. 7, in the column of light-emitting devices 110, a light-emitting device in a first row is coupled to a first pixel circuit in a first row; a light-emitting device in a second row is coupled to a first pixel circuit in a second row; a light-emitting device in a third row is coupled to a first pixel circuit in a third row; a light-emitting device in a fourth row is coupled to a first pixel circuit in a fourth row; a light-emitting device in a fifth row is coupled to the first pixel circuit in the first row; a light-emitting device in a sixth row is coupled to the first pixel circuit in the second row; a light-emitting device in a seventh row is coupled to the first pixel circuit in the third row; a light-emitting device in an eighth row is coupled to a first pixel circuit in the fourth row, and so on. In this case, the first pixel circuits in the first row to the fourth row drive the light-emitting devices in the first row to the fourth row in sequence, and after the first pixel circuit in the fourth row drives the light-emitting device in the fourth row, the first pixel circuit in the first row starts to drive the light-emitting device in the fifth row. The first pixel circuits in the first row to the fourth row drive the light-emitting devices in the fifth row to the eighth row in sequence, and so on.

In some embodiments, referring to FIGS. 4 and 7, transistors coupled to the same first pixel circuit are coupled to the same driving signal line. In this case, at least two light-emitting devices 110 are coupled to a single first pixel circuit 120 through a single driving signal line 132, so that the number of driving signal lines 132 may be reduced, and the wiring design of the display panel 100 is simplified.

For example, in a case where a column of first pixel circuits 120 includes two first pixel circuits 120, for a column of light-emitting devices 110 coupled to the column of first pixel circuits 120, transistors 133 coupled to light-emitting devices in odd-numbered rows are coupled to one of the two first pixel circuits 120 through a single driving signal line 132, and transistors 133 coupled to light-emitting devices in even-numbered rows are coupled to the other of the two first pixel circuits 120 through a single driving signal line 132. In this case, two driving signal lines 132 may be disposed at a position where the column of light-emitting devices is located, so that the two first pixel circuits 120 may drive all light-emitting devices in the column of light-emitting devices in a time-division manner. For example, in a case where a column of light-emitting devices includes eight light-emitting devices, compared with a situation where the eight light-emitting devices are respectively coupled to eight first pixel circuits in a column through eight driving signal lines, in the embodiment of the present disclosure, the eight light-emitting devices may be coupled to two first pixel circuits in a column through two driving signal lines, so that the number of driving signal lines coupled to a column of light-emitting devices is reduced from eight to two. Therefore, the number of driving signal lines 132 may be reduced, which avoids a situation where the driving signal lines 132 are arranged in multiple layers in the first display region A1 due to an excessive number of driving signal lines 132, and avoids a complicated process and an increased production cost.

Figure 8A:
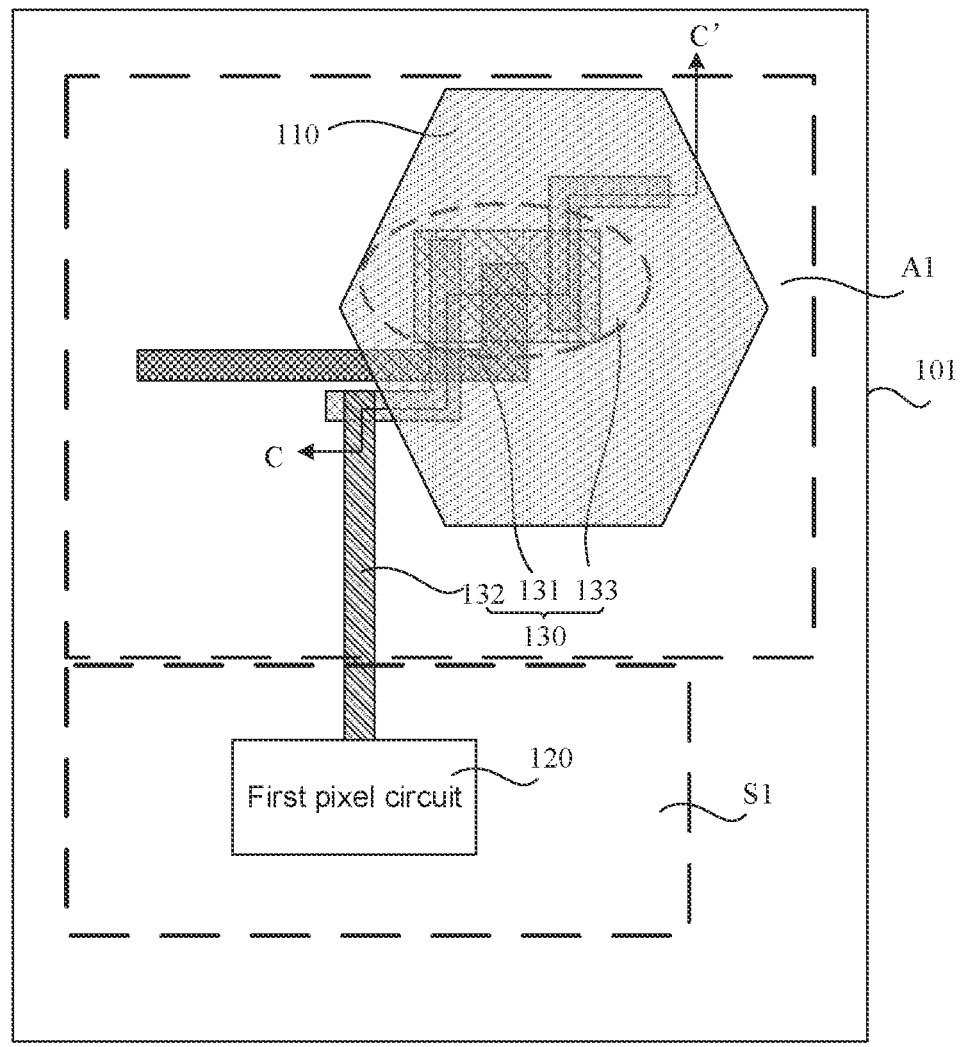
FIG. 8A is a structural diagram of yet another display panel, in accordance with some embodiments.
Figure 8B:
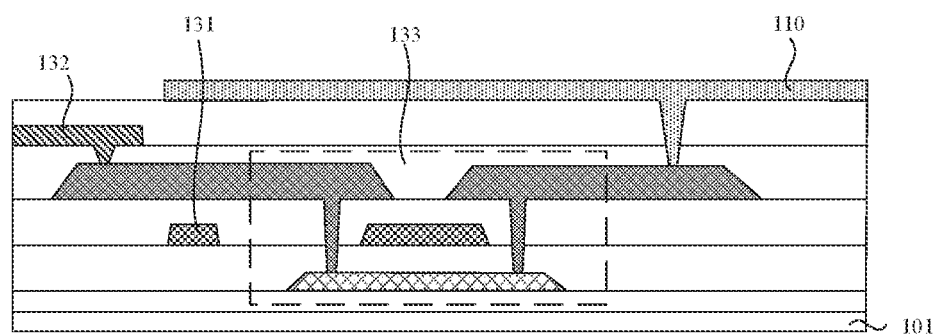
FIG. 8B is a sectional view of the display panel in FIG. 8A taken along the C-C' line.

In some embodiments, as shown in FIGS. 8A and 8B, the plurality of transistors 133 are located on a side of the plurality of light-emitting devices 110 proximate to the substrate 101. An orthographic projection of at least one transistor 133 on the substrate 101 overlaps with orthographic projections of the light-emitting devices 110 on the substrate 101. For example, referring to FIG. 8A, the orthographic projection of the light-emitting device 110 on the substrate 101 may overlap with an orthographic projection of a single transistor 133 on the substrate 101. In this case, the light-emitting device 110 may shield at least one transistor 133, thereby increasing an aperture ratio of the first display region A1.

The plurality of driving signal lines 132 are located between the plurality of transistors 133 and the plurality of light-emitting devices 110. For example, the driving signal line 132 is coupled to transistors 133 through via holes penetrating a layer between the driving signal line 132 and the transistors 133. The light-emitting device 110 is coupled to the transistor 133 through a via hole penetrating a layer between the light-emitting device 110 and the transistor 133.

It will be noted that, for simplifying the description, only the anode of the light-emitting device 110 is illustrated in FIGS. 8A and 8B.

For example, referring to FIGS. 9A to 9E, the display panel 100 includes a first pattern layer 121, a second pattern layer 122, a third pattern layer 123 and a fourth pattern layer 124 that are sequentially stacked on the substrate 101. A layout of the first pixel circuit 120 may be obtained according to conductive patterns in each pattern layer. The first pixel circuit and the second pixel circuit have a same structure.

Figure 5:
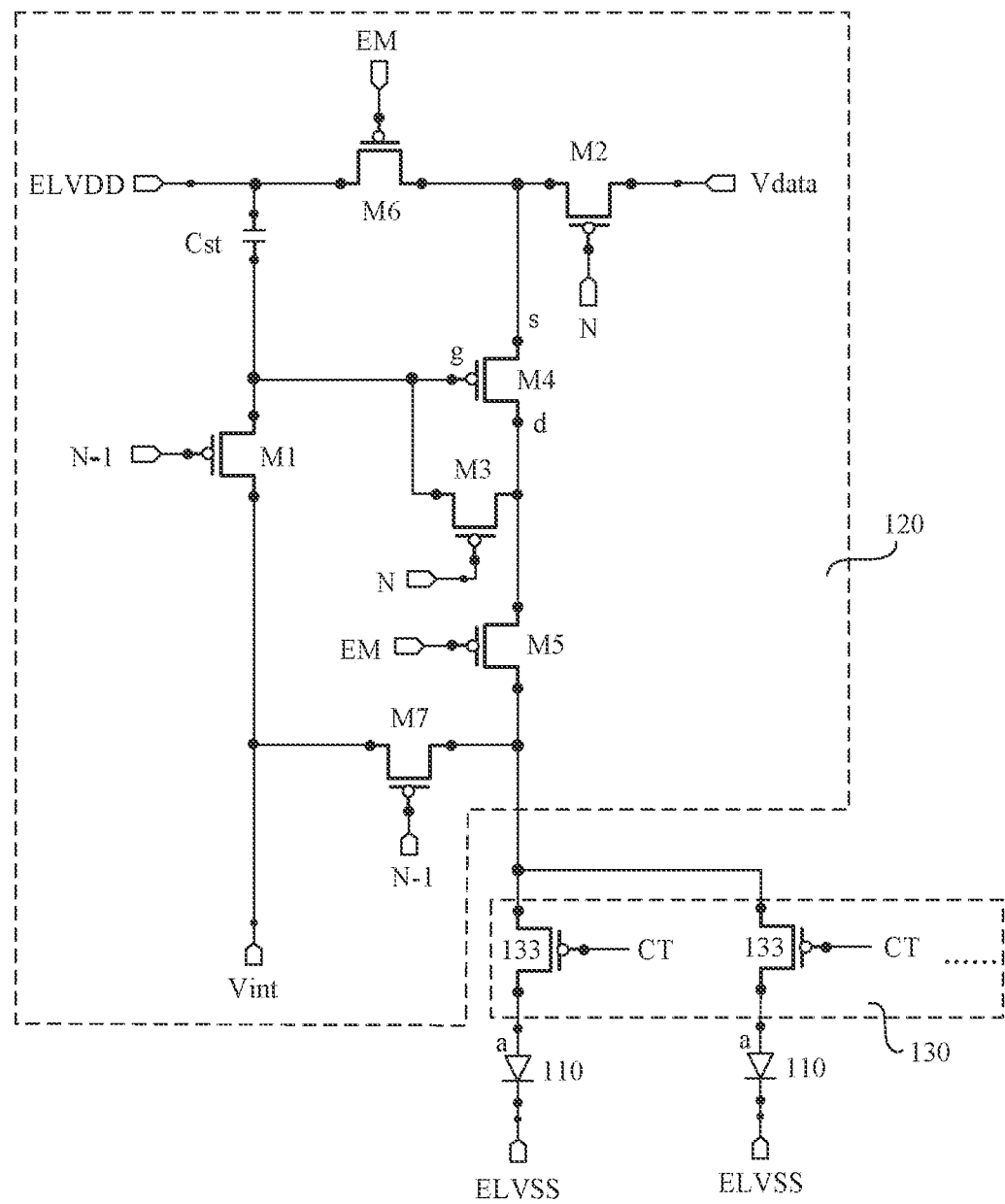
FIG. 5 is a circuit diagram of a first pixel circuit and a gating circuit, in accordance with some embodiments.
Figure 9A:
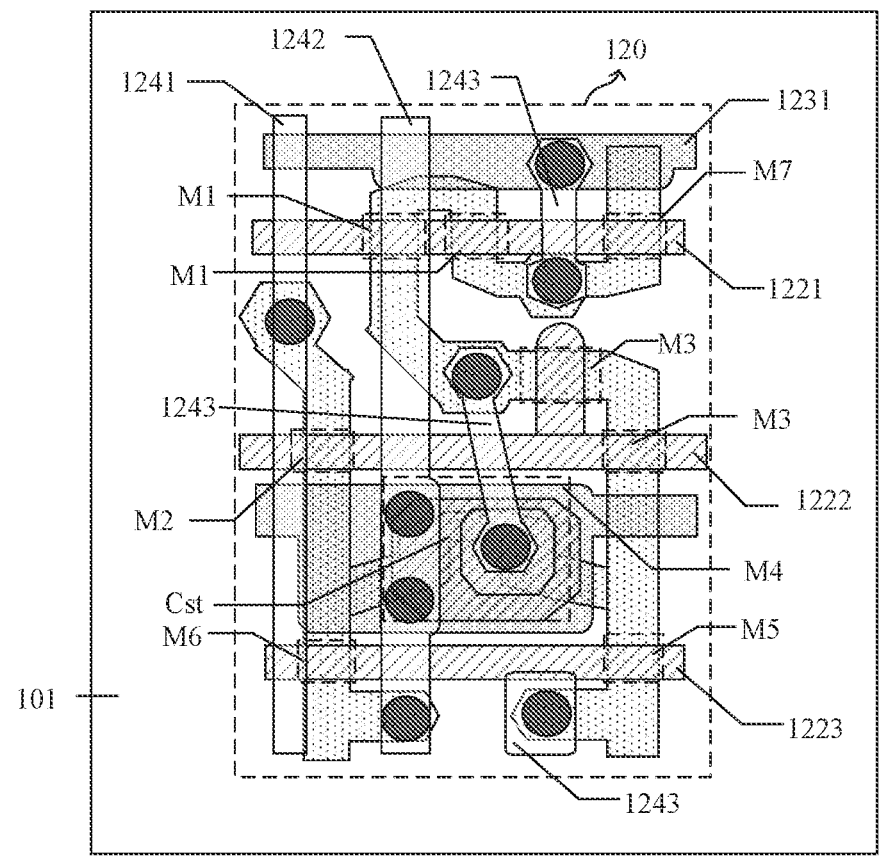
FIG. 9A is a structural diagram of yet another display panel, in accordance with some embodiments.
Figure 9B:
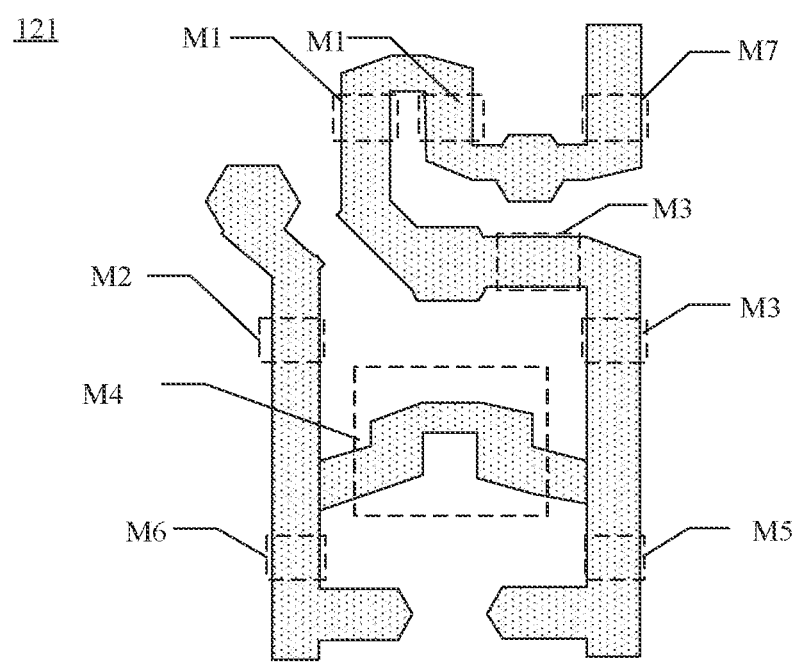
FIG. 9B is a structural diagram of a first pattern layer, in accordance with some embodiments.
Figure 9C:
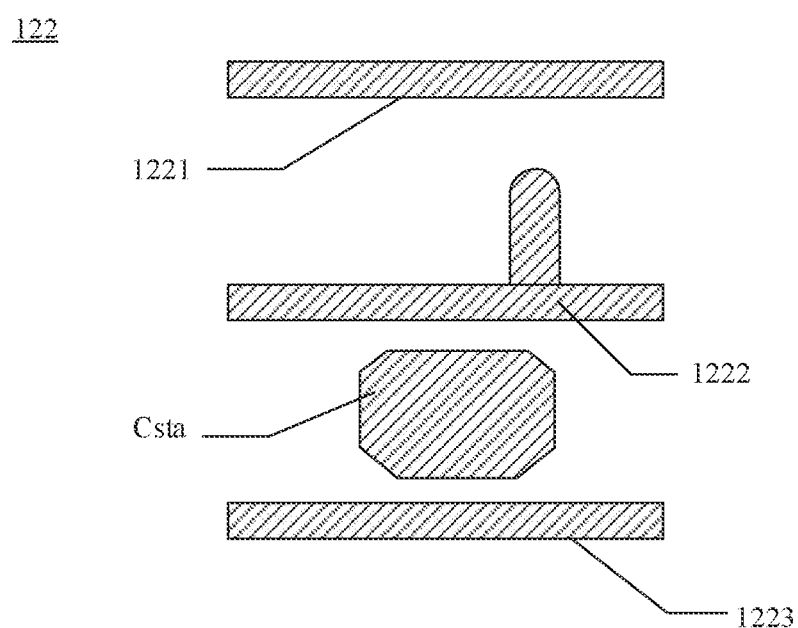
FIG. 9C is a structural diagram of a second pattern layer, in accordance with some embodiments.
Figure 9D:
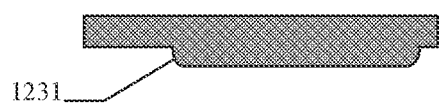
FIG. 9D is a structural diagram of a third pattern layer, in accordance with some embodiments.
Figure 9D:
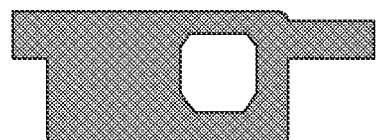
Figure 9E:
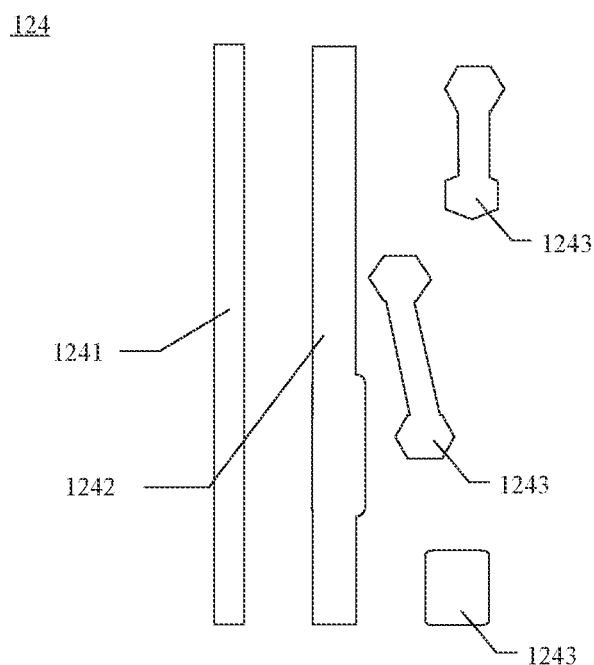
FIG. 9E is a structural diagram of a fourth pattern layer, in accordance with some embodiments.

The first pattern layer 121 includes semiconductor patterns of transistors in the pixel circuit. For example, a portion of a semiconductor pattern may serve as an active layer pattern of a transistor, and a portion of the semiconductor pattern may serve as a source-drain pattern of the transistor. With reference to FIGS. 5 and 9C, the second pattern layer 122 includes conductive patterns 1221 for transmitting reset signals N−1, conductive patterns 1222 for transmitting gate signals N, first electrode plates Csta of storage capacitors Cst, and conductive patterns 1223 for transmitting light-emitting signals EM. The conductive patterns 1221, the conductive patterns 1222 and the conductive patterns 1223 serve as gate patterns of the transistors in the pixel circuit. With reference to FIGS. 5 and 9D, the third pattern layer 123 includes conductive patterns 1231 for transmitting initial voltages Vint and second electrode plates Cstb of the storage capacitors Cst. With reference to FIGS. 5 and 9E, the fourth pattern layer 124 includes conductive patterns 1241 for transmitting data signals Vdata, conductive patterns 1242 for transmitting power voltages ELVDD, and a plurality of connection patterns 1243.

In this case, for example, the control signal lines 131 may be located in the second pattern layer 122. That is, the control signal lines 131 may be arranged in the same layer as the conductive patterns 1221, the conductive patterns 1222 and the conductive patterns 1223. For example, the light-emitting devices 110 are farther away from the substrate 101 than the fourth pattern layer 124. For example, the gate of the transistor 133 may be located in the second pattern layer; the semiconductor pattern of the transistor 133 may be located in the first pattern layer; and the source and the drain of the transistor 133 may be located in the fourth pattern layer, or portions of the semiconductor pattern of the transistor 133 may be served as the source and the drain of the transistor 133. For example, the driving signal lines 132 are located between the light-emitting devices 110 and the first pixel circuits 120, and a layer where the driving signal lines 132 are located is farther away from the substrate 101 than the fourth pattern layer 124. For example, the driving signal lines are arranged on a side of the fourth pattern layer away from the substrate, and there is an insulating layer provided between the fourth pattern layer and the driving signal lines. The light-emitting devices are arranged on a side of the driving signal lines away from the substrate, and there is also an insulating layer provided between the driving signal lines and the light-emitting devices. In this case, in the second display region, there may be at least two insulating layers between second pixel circuits and light-emitting devices coupled thereto.

For example, referring to FIG. 4, the orthographic projection of each light-emitting device 110 on the substrate 101 overlaps with the orthographic projection of a transistor 133 coupled to the light-emitting device 110 on the substrate 101. In this case, each light-emitting device 110 may shield each transistor 133, so that the aperture ratio of the first display region A1 is greatly improved.

It can be understood that, each transistor 133 is located below each light-emitting device 110 (i.e., located on a side of the light-emitting device 110 proximate to the substrate 101), and the transistors 133 are uniformly distributed in the first display region A1. Correspondingly, the plurality of control signal lines 131 are also uniformly distributed on the display panel 100. In this case, in the column direction in which the light-emitting devices 110 are arranged (e.g., in the vertical direction Y), the plurality of control signal lines 131 are distributed at intervals, and a spacing between any adjacent two control signal lines 131 is approximately equal.

Figure 10:
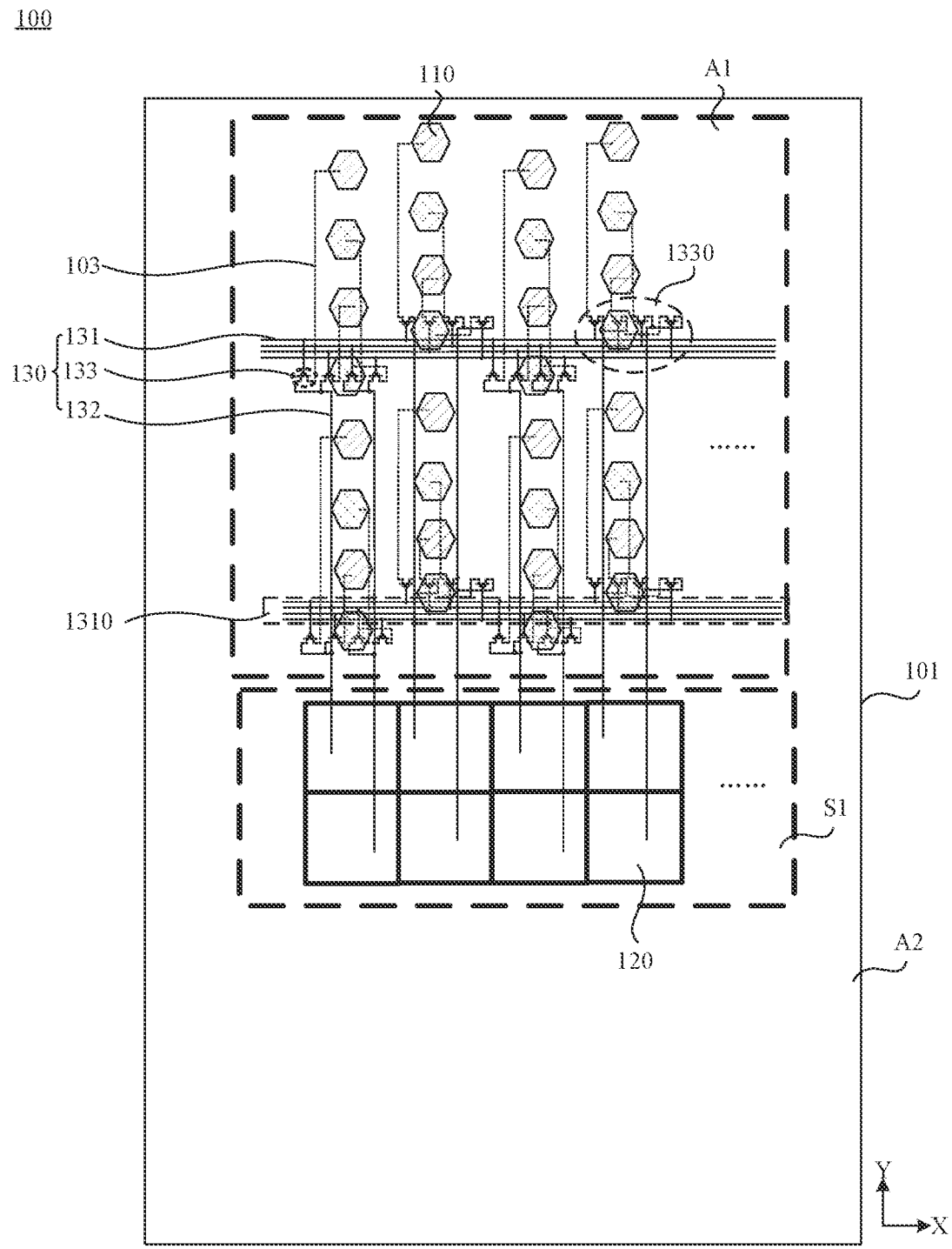
FIG. 10 is a structural diagram of yet another display panel, in accordance with some embodiments.

For example, as shown in FIG. 10, transistors 133 coupled to a column of light-emitting devices 110 are divided into a plurality of transistor groups 1330, and each transistor group 1330 includes at least two transistors 133. In the column direction in which the light-emitting devices 110 are arranged, light-emitting devices 110 coupled to the at least two transistors 133 are continuously distributed, and adjacent two transistor groups 1330 are separated by at least one light-emitting device 110.

In the direction perpendicular to the column direction in which the light-emitting devices 110 are arranged, the at least two transistors 133 may be arranged sequentially, and may be arranged in a line (i.e., arranged side by side or in alignment). For example, as shown in FIG. 10, among the transistors 133 coupled to the column of light-emitting devices 110, every four transistors 133 constitute a transistor group 1330. In the column direction in which the light-emitting devices 110 are arranged, adjacent two transistor groups 1330 are separated by three light-emitting devices 110. For example, four transistors 133 in one of the adjacent two transistor groups 1330 and four transistors 133 in the other one of the adjacent two transistor groups 1330 are separated by the three light-emitting devices 110. Four transistors 133 in a transistor group 1330 are arranged side by side in the direction perpendicular to the column direction in which the light-emitting devices 110 are arranged.

In this case, at least two transistors 133 may be distributed in a concentrated manner. A spacing between the at least two transistors 133 is small, and a spacing between at least two transistors 133 in adjacent two transistor groups 1330 is large. In this way, the diffraction of light passing through the transistors 133 may be avoided, and thus the effect of under-screen sensing may be improved.

For example, as shown in FIG. 10, the plurality of control signal lines 131 are divided into a plurality of control signal line groups 1310. Each control signal line group 1310 includes at least two control signal lines 131. In the column direction in which the light-emitting devices 110 are arranged, light-emitting devices 110 coupled to the at least two control signal lines 131 are continuously distributed, and adjacent two control signal line groups 1310 are separated by at least one light-emitting device 110. A spacing between the at least two control signal lines 131 in the control signal line group 1310 is less than a spacing between adjacent two light-emitting devices 110.

It can be understood that, at least two control signal lines 131 coupled to at least two transistors 133 in a transistor group 1330 may be distributed in a concentrated manner. Control signal lines 131 coupled to adjacent two transistor groups 1330 are separated by at least one light-emitting device. For example, in a case where a transistor group 1330 includes four transistors 133, four control signal lines 131 coupled to the four transistors 133 may be located in a region between adjacent two light-emitting devices 110 arranged in the vertical direction Y, and the control signal lines 131 coupled to adjacent two transistor groups 1330 are separated by at least three light-emitting devices arranged in the vertical direction Y.

In this case, a spacing between the at least two control signal lines 131 in the control signal line group 1310 is small, and at least two control signal lines 131 in a control signal line group 1310 and at least two control signal lines 131 in another control signal line group 1310 adjacent thereto have a large spacing therebetween. In this way, at least two control signal lines 131 in the display panel 100 are distributed in a concentrated manner, which may avoid the diffraction of light passing through the control signal lines 131, so that the effect of under-screen sensing may be improved.

In a case where at least two control signal lines 131 are distributed in a concentrated manner, and at least two transistors 133 are distributed in a concentrated manner, a spacing between a transistor 133 and a corresponding light-emitting device 110 is large. Therefore, as shown in FIG. 10, the transistor 133 may be coupled to the corresponding light-emitting device 110 through a connection lead 103. For example, the connection lead 103 may be transparent, so as to avoid affecting the transmittance of the first display region A1. The connection lead 103 and the driving signal line 132 are made of a same material. For example, the connection lead 103 and the driving signal line 132 may be formed by patterning a same film layer, thereby simplifying the production process.

Figure 11:
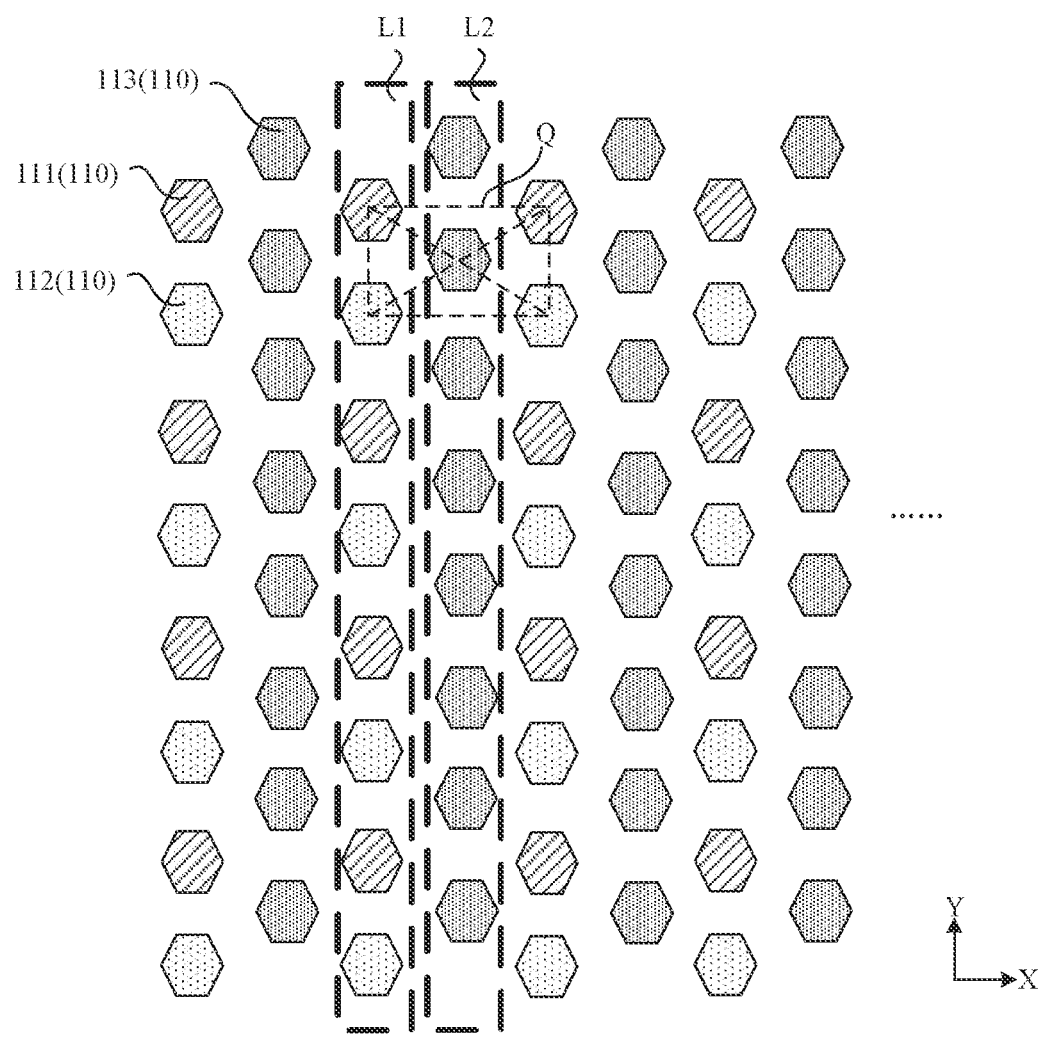
FIG. 11 is a distribution diagram of light-emitting devices in a first display region, in accordance with some embodiments.

For example, as shown in FIG. 11, the plurality of light-emitting devices 110 include first color light-emitting devices 111, second color light-emitting devices 112 and third color light-emitting devices 113. The first light-emitting device column L1 includes first color light-emitting devices 111 and second color light-emitting devices 112 that are arranged sequentially at intervals, and the second light-emitting device column L2 includes third color light-emitting devices 113 arranged at intervals. In the direction perpendicular to the column direction in which the light-emitting devices 110 are arranged (e.g., the horizontal direction X in FIG. 11), a light-emitting device 110 in each row in the first light-emitting device column L1 and a light-emitting device 110 in a corresponding row in the second light-emitting device column L2 are arranged in a staggered manner.

A first color, a second color and a third color are three primary colors. For example, the first color is blue, the second color is red, and the third color is green. In this case, the first light-emitting device column L1 includes blue light-emitting devices 111 and red light-emitting devices 112 arranged sequentially at intervals, and the second light-emitting device column L2 includes green light-emitting devices 113 arranged at intervals.

It will be noted that, the staggered manner means that in the direction perpendicular to the column direction in which the light-emitting devices 110 are arranged (e.g., the horizontal direction X in FIG. 11), geometric centers of light-emitting devices in a same row in all columns of light-emitting devices are not completely on a straight line. That is, in the direction perpendicular to the column direction in which the light-emitting devices 110 are arranged, a connection line obtained by sequentially connecting the geometric centers of the light-emitting devices in the same row in all the columns of light-emitting devices is a broken line. For example, a connection line of connecting geometric centers of two light-emitting devices in a same row in one first light-emitting device column L1 and one second light-emitting device column L2 that are adjacent extends in a direction intersecting the direction perpendicular to the column direction in which the light-emitting devices 110 are arranged. A connection line of geometric centers of two light-emitting devices in a same row in adjacent two first light-emitting device columns L1 extends in the direction perpendicular to the column direction in which the light-emitting devices 110 are arranged. A connection line of geometric centers of two light-emitting devices in a same row in adjacent two second light-emitting device columns L2 extends in the direction perpendicular to the column direction in which the light-emitting devices 110 are arranged.

Figure 12:
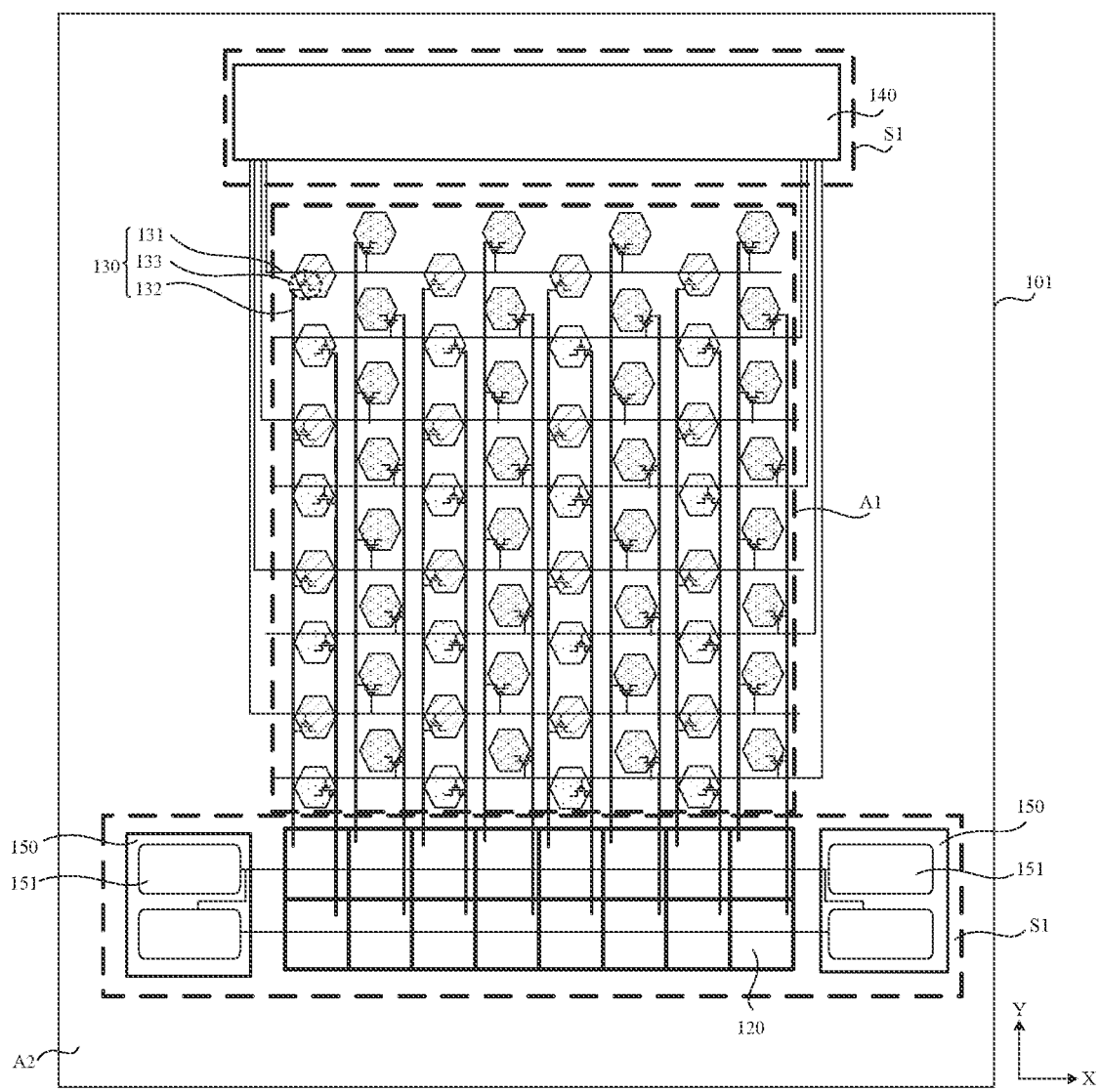
FIG. 12 is a structural diagram of yet another display panel, in accordance with some embodiments.

In some embodiments, as shown in FIG. 12, the display panel 100 further includes first driving circuit(s) 140 and second driving circuit(s) 150. The first driving circuit(s) 140 and the second driving circuit(s) 150 are disposed in the first peripheral region S1. The first driving circuit(s) 140 each include a plurality of first shift register circuits 141 connected in cascade, and a first shift register circuit 141 is coupled to a control signal line 131. The second driving circuit(s) 150 each include a plurality of second shift register circuits 151 connected in cascade, and a second shift register circuit 151 is coupled to a row of first pixel circuits 120.

The first driving circuit 140 is configured to provide a control signal to the control signal line 131, so that a transistor 133 coupled to the control signal line 131 is turned on, and a light-emitting device 110 coupled to the transistor 133 and a first pixel circuit 120 form a conductive path. The second driving circuit 150 is configured to provide a scan signal to a first pixel circuit 120, so that the first pixel circuit 120 drives a light-emitting device 110 coupled thereto to emit light in a case where the first pixel circuit 120 and the light-emitting device 110 form a conductive path.

It can be understood that, the plurality of first shift registers 141 connected in cascade in the first driving circuit 140 output control signals to the plurality of control signal lines 131 in sequence, so that the transistors 133 coupled to the plurality of control signal lines 131 are turned on row by row. The plurality of second shift register circuits 151 connected in cascade in the second driving circuit 150 output scan signals to a plurality of rows of first pixel circuits 120 in sequence, so that data signals are written into the plurality of rows of first pixel circuits 120 row by row.

Figure 13:
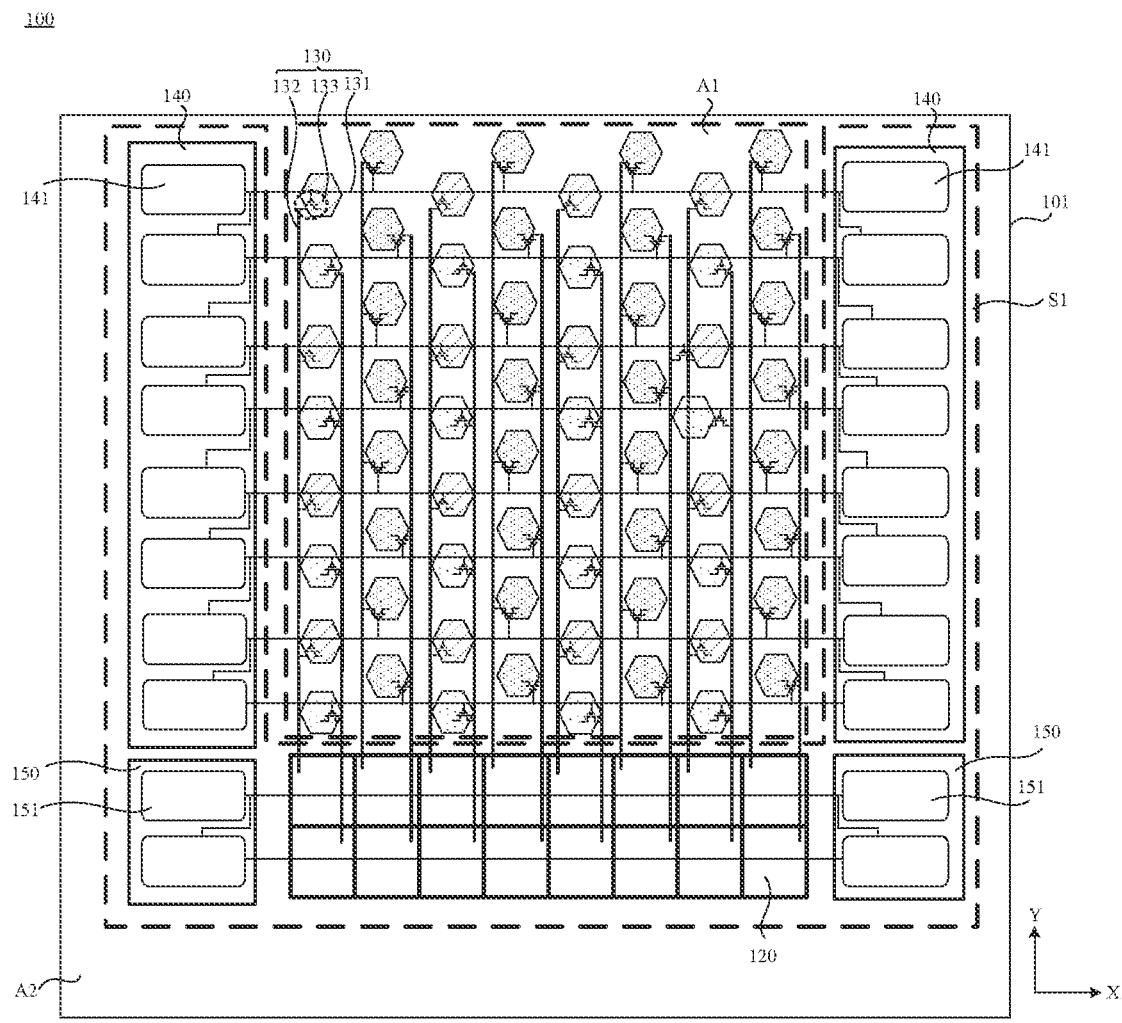
FIG. 13 is a structural diagram of yet another display panel, in accordance with some embodiments.

In this case, compared with a situation where the number of the first pixel circuits 120' and the number of the second driving circuits 150' in the display panel 100' shown in FIG. 6 are large, the number of the first pixel circuits 120 and the number of the second driving circuits 150 in the display panel 100 shown in FIG. 13 are small, so that the area of the first peripheral region S1 is reduced, and it is convenient to realize the narrow bezel of the display panel 100.

Figure 14:
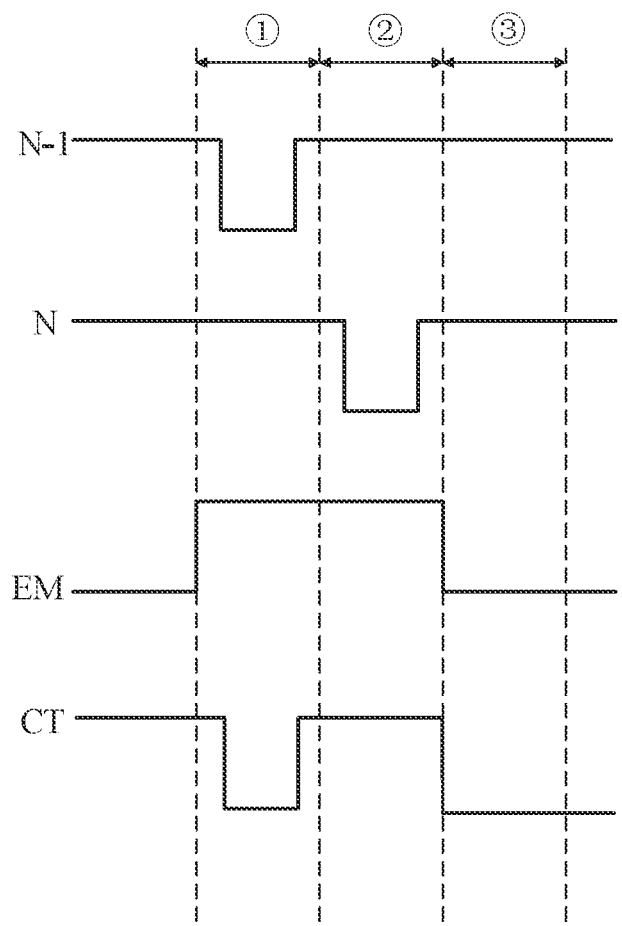
FIG. 14 is a timing diagram of signals used for driving a first pixel circuit, in accordance with some embodiments.

For example, as shown in FIG. 5, control electrodes of a part of the switching transistors (e.g., M1 and M7) in the first pixel circuit 120 are used to receive the reset signal N−1 as shown in FIG. 14; control electrodes of another part of the switching transistors (e.g., M2 and M3) are used to receive the gate signal N as shown in FIG. 14; and control electrodes of yet another part of the switching transistors (e.g., M5 and M6) are used to receive the light-emitting signal EM as shown in FIG. 14. It will be noted that, the first pixel circuit 120 in FIG. 5 is merely an illustration, and a specific circuit structure of the first pixel circuit 120 in an actual situation is not limited thereto.

On this basis, an operating process of the first pixel circuit 120 shown in FIG. 5 includes three phases shown in FIG. 14, i.e., a first phase ①, a second phase ②, and a third phase ③. In the first phase ①, the switching transistor M1 and the switching transistor M7 are turned on under control of the reset signal N−1; a transistor 133 coupled to a light-emitting device 110 to be driven in at least two transistors 133 in the gating circuit 130 is turned on under control of a control signal CT received at a control signal line 131; and the switching transistor M1 transmits an initial voltage Vint to a control electrode g of the driving transistor M4, and the switching transistor M7 and the transistor 133 coupled to the light-emitting device 110 to be driven transmit the initial voltage Vint to an anode a of the light-emitting device 110 to be driven, so as to reset the anode a of the light-emitting device 110 to be driven and the control electrode g of the driving transistor M4. In the second phase ②, the switching transistors M2 and M3 are turned on under control of the gate signal N, and the control electrode g of the driving transistor M4 is coupled to a second electrode d thereof, so that the driving transistor M4 is in a diode-conducting state. In this case, the switching transistor M2 writes the data signal Vdata into a first electrode s of the driving transistor M4, so as to compensate a threshold voltage of the driving transistor M4. In the third phase ③, the switching transistor M5 and the switching transistor M6 are turned on under control of the light-emitting signal EM, and the transistor 133 coupled to the light-emitting device 110 to be driven in the at least two transistors 133 in the gating circuit 130 is turned on under control of the control signal CT received at the control signal line 131; the driving transistor M4, the switching transistor M5 and the switching transistor M6 form a conductive path with the light-emitting device 110 to be driven through the gating circuit 130, so that a current path between a power voltage ELVDD and another power voltage ELVSS is turned on. A driving current generated by the driving transistor M4 according to the data signal Vdata is transmitted to the light-emitting device 110 to be driven. Therefore, the at least two light-emitting devices 110 are driven to emit light in a time-division manner.

Figure 15:
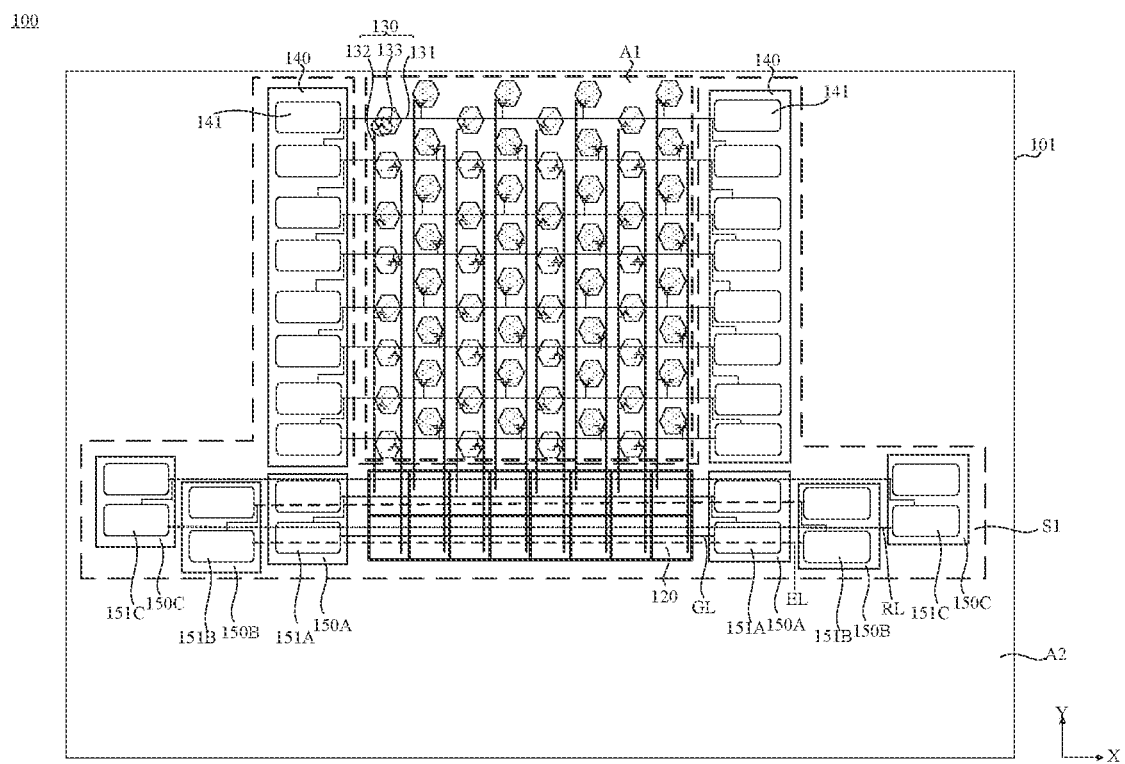
FIG. 15 is a structural diagram of yet another display panel, in accordance with some embodiments.

In this case, as shown in FIG. 15, the at least one second driving circuit 150 includes three second driving circuits, which are a second driving circuit 150A, a second driving circuit 150B and a second driving circuit 150C. The second driving circuit 150A is coupled to the first pixel circuits 120 through gate lines GL, and is used for providing gate signals N to the first pixel circuits 120. The second driving circuit 150B is coupled to the first pixel circuits 120 through light-emitting signal lines EL, and is used for providing light-emitting signals EM to the first pixel circuits 120. The second driving circuit 150C is coupled to the first pixel circuits 120 through reset signal lines RL, and is used for providing reset signals N−1 to the first pixel circuits 120.

In this case, referring to FIGS. 5 and 15, the second driving circuit 150A includes a plurality of second shift register circuits 151A connected in cascade, and control electrodes of switching transistors M2 and switching transistors M3 of first pixel circuits 120 in a row may be coupled to a signal output terminal of a second shift register circuit 151A in the second driving circuit 150A. The second driving circuit 150B includes a plurality of second shift register circuits 151B connected in cascade, and control electrodes of switching transistors M5 and switching transistors M6 of first pixel circuits 120 in a row may be coupled to a signal output terminal of a second shift register circuit 151B in the second driving circuits 150B. The second driving circuit 150C includes a plurality of second shift register circuits 151C connected in cascade, and control electrodes of switching transistors M1 and switching transistors M7 of first pixel circuits 120 in a row may be coupled to a signal output terminal of a second shift register circuit 151C in the second driving circuit 150C.

Alternatively, the at least one second driving circuit 150 includes two second driving circuits, which are a second driving circuit 150A and a second driving circuit 150B. In this case, the second driving circuit 150A provides gate signals N to the first pixel circuits 120, and a gate signal N of a row of first pixel circuits 120 may serve as a reset signal N−1 of a previous row of first pixel circuits 120. In this case, control electrodes of transistors M2 and transistors M3 in the row of first pixel circuits 120, and control electrodes of transistors M2 and transistors M3 in the previous row of first pixel circuits 120 may be coupled to a signal output terminal of a second shift register circuit 151A in the second driving circuits 150A.

It will be noted that, the first driving circuit 140 and the second driving circuit 150 may adopt any circuit or module capable of realizing corresponding functions in the field, which may be selected by those skilled in the art according to situations in practical applications, and details will not be limited in the present disclosure.

In some embodiments, as shown in FIG. 12, in the column direction in which the light-emitting devices 110 are arranged (e.g., the vertical direction Y in FIG. 12), a first driving circuit 140 is located on one of two opposite sides of the first display region A1 proximate to an edge of the display panel 100. In this case, a width of a bezel around the first display region A1 may be reduced, and the display effect of the display panel 100 is improved.

For example, portions of the plurality of control signal lines 131 are located on one of two opposite sides of the first display region A1 in the direction perpendicular to the column direction in which the light-emitting devices 110 are arranged, and extend to the first peripheral region S1 to be coupled to the first driving circuit 140. Alternatively, one control signal line 131 of adjacent two control signal lines 131 (e.g., a control signal line coupled to an odd-numbered row of light-emitting devices) is located on one side of two opposite sides of the first display region A1 in the direction perpendicular to the column direction in which the light-emitting devices 110 are arranged, and extends to the first peripheral region S1 to be coupled to the first driving circuit 140; the other control signal line 131 of the adjacent two control signal lines 131 (e.g., a control signal line coupled to an even-numbered row of light-emitting devices) is located on the other side of the two opposite sides of the first display region A1 in the direction perpendicular to the column direction in which the light-emitting devices 110 are arranged, and extends to the first peripheral region S1 to be coupled to the first driving circuit 140.

Figure 16:
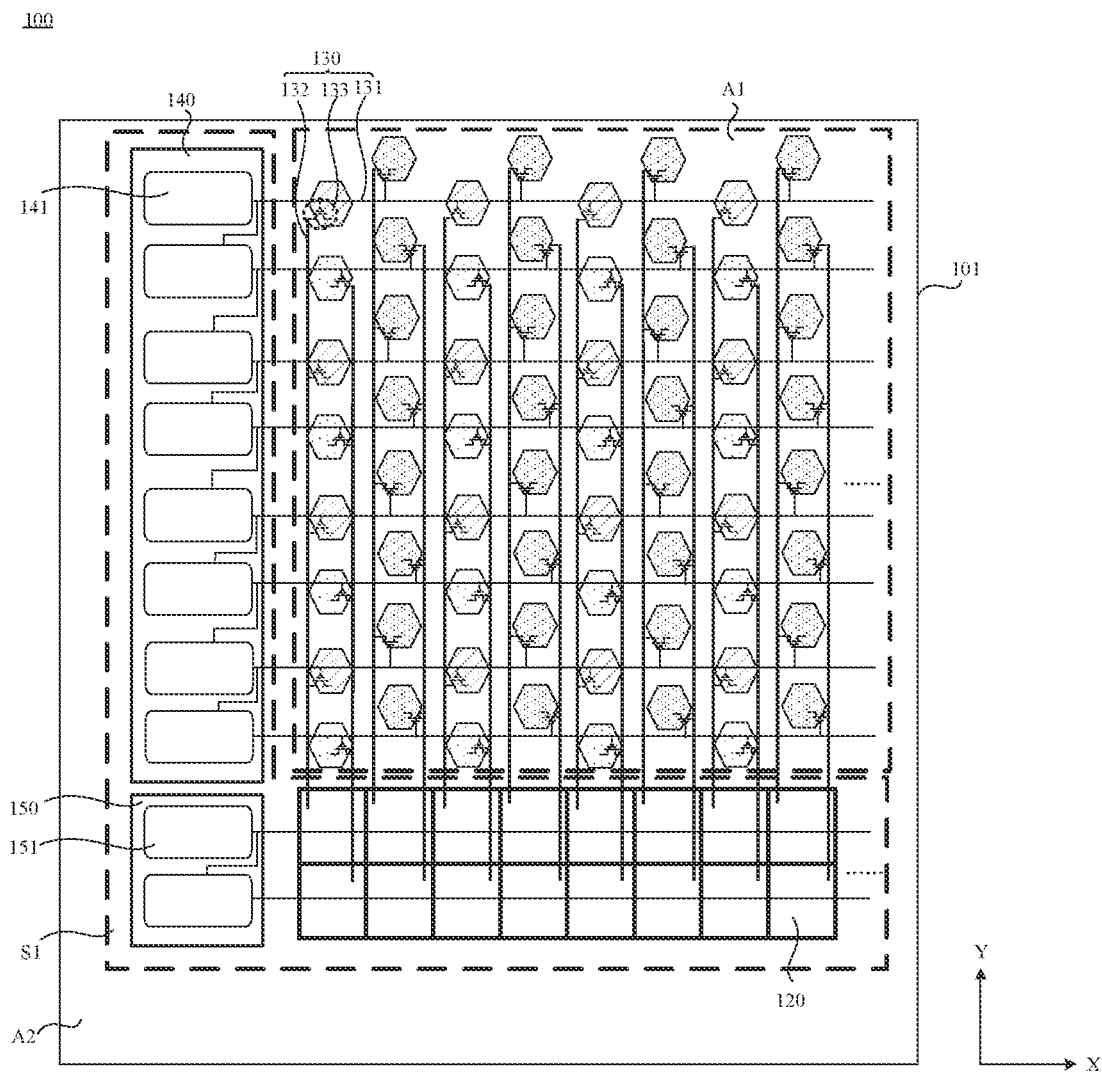
FIG. 16 is a structural diagram of yet another display panel, in accordance with some embodiments.

In some embodiments, as shown in FIG. 13, first driving circuits 140 are located on two opposite sides of the first display region A1 in the direction perpendicular to the column direction in which the light-emitting devices 110 are arranged (e.g., the horizontal direction X in FIG. 13). Alternatively, as shown in FIG. 16, the first driving circuit 140 is located on one of the two opposite sides of the first display region A1 in the direction perpendicular to the column direction in which the light-emitting devices 110 are arranged. For example, the first driving circuit 140 may be located in the first peripheral region S1 and on a side of the second display region A2 away from the first display region A1, or the first driving circuit 140 may be located in the first peripheral region S1 and between the first display region A1 and the second display region A2.

It can be understood that, in a case where two first driving circuits 140 are disposed on the two sides of the first display region A1 in the direction perpendicular to the column direction in which the light-emitting devices 110 are arranged, the display panel 100 adopts a double-sided simultaneous driving manner. That is, the two first driving circuits 140 provide control signals simultaneously to the control signal lines 131 row by row from the two sides, which may reduce voltage drops on the control signal lines 131 in a process of transmitting signals, thereby improving the display uniformity. Alternatively, the display panel 100 may adopt a double-sided alternate driving manner. That is, the two first driving circuits 140 provide the control signals alternately to the control signal lines 131 row by row from the two sides. In a case where the first driving circuit 140 is disposed on a single side of the first display region A1 in the direction perpendicular to the column direction in which the light-emitting devices 110 are arranged, the first driving circuit 140 in the display panel 100 provides the control signals to the control signal lines 131 row by row from the single side. In this way, it is possible to reduce the area of the first peripheral region S1 outside the first display region A1, and simplify the circuit design of the display panel 100.

In some embodiments, as shown in FIG. 13, second driving circuits 150 are located on the two opposite sides of the first display region A1 in the direction perpendicular to the column direction in which the light-emitting devices 110 are arranged (e.g., the horizontal direction X in FIG. 13). Alternatively, as shown in FIG. 16, the second driving circuit 150 is located on one of the two opposite sides of the first display region A1 in the direction perpendicular to the column direction in which the light-emitting devices 110 are arranged.

It can be understood that, in a case where two second driving circuits 150 are disposed on the two sides of the first display region A1 in the direction perpendicular to the column direction in which the light-emitting devices 110 are arranged, the display panel 100 adopts a double-sided simultaneous driving manner. That is, the two second driving circuits 150 provide control signals simultaneously to all rows of first pixel circuits 120 row by row from the two sides, which may reduce a voltage drop on a signal line (e.g., a gate line) in a process of the second driving circuit 150 transmitting a signal to each row of first pixel circuits 120 through the signal line, thereby improving the display uniformity. Alternatively, the display panel 100 may adopt a double-sided alternate driving manner. That is, the two second driving circuits 150 provide the scan signals alternately to all rows of first pixel circuits 120 row by row from the two sides. In a case where the second driving circuit 150 is disposed on the single side of the first display region A1 in the direction perpendicular to the column direction in which the light-emitting devices 110 are arranged, the second driving circuit 150 in the display panel 100 provides the scan signals to the rows of first pixel circuits 120 row by row from the single side. In this way, it is possible to reduce the area of the first peripheral region S1 outside the first display region A1, and simplify the circuit design of the display panel 100.

Figure 17:
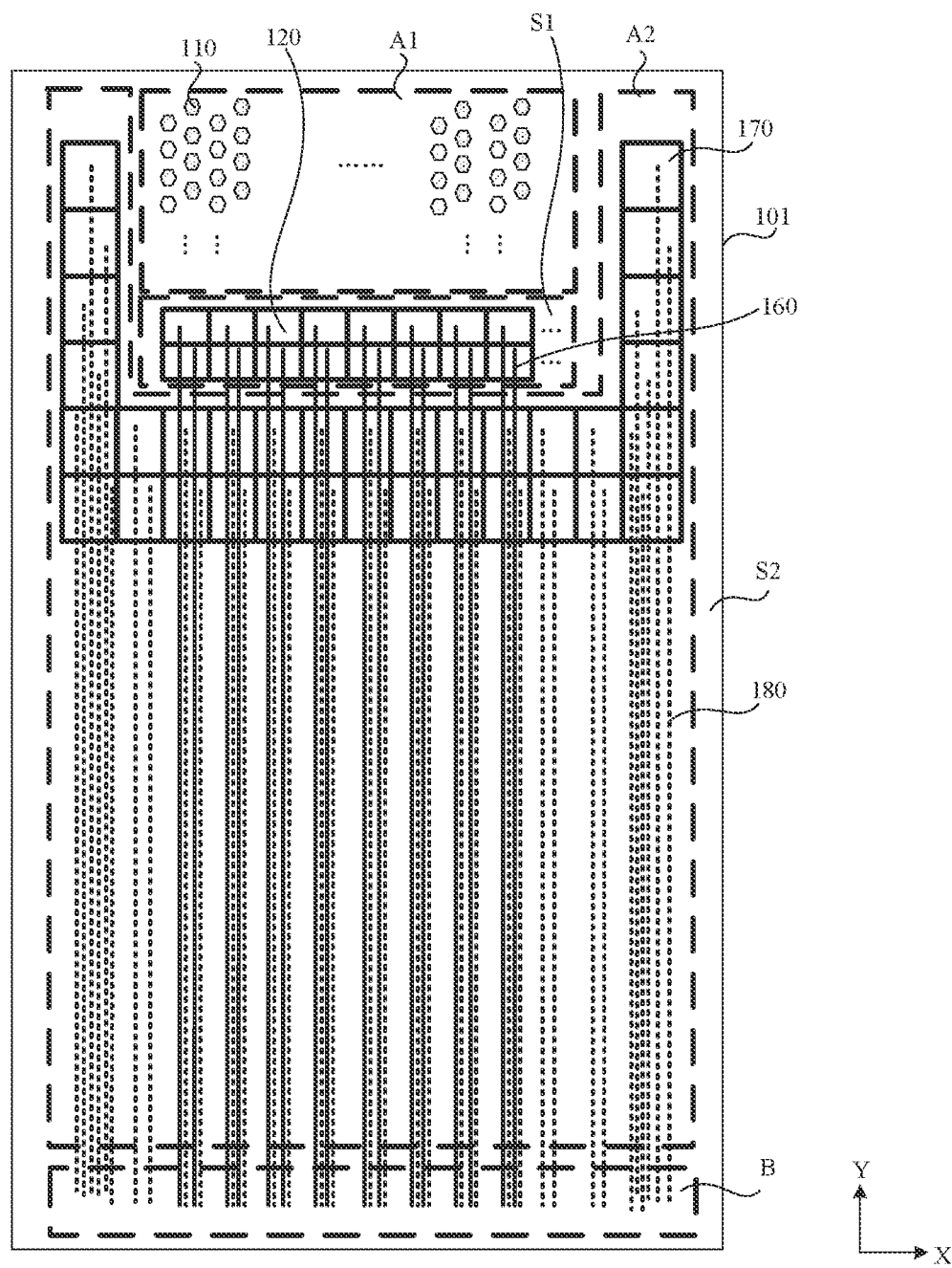
FIG. 17 is a structural diagram of yet another display panel, in accordance with some embodiments.

In some embodiments, as shown in FIG. 17, the display panel 100 further includes a plurality of first data lines 160, a plurality of second pixel circuits 170 and a plurality of second data lines 180. The plurality of first data lines 160 are disposed on the substrate 101, and the plurality of first data lines 160 are coupled to the plurality of first pixel circuits 120. The plurality of second pixel circuits 170 are disposed on the substrate 101 and located in the second display region A2. The plurality of second data lines 180 are disposed on the substrate 101, and the plurality of second data lines 180 are coupled to the plurality of second pixel circuits 170.

For example, the second pixel circuits 170 have a same circuit structure as the first pixel circuits 120, and the second pixel circuits 170 and the first pixel circuits 120 may be synchronously formed in processes.

A first data line 160 is coupled to first pixel circuits 120 in a column, and the first data line 160 is configured to provide a data signal to the first pixel circuits 120 coupled to the first data line 160, so that data is written into the first pixel circuits 120. A second data line 180 is coupled to second pixel circuits 170 in a column, and the second data line 180 is configured to provide a data signal to the second pixel circuits 170 coupled to the second data line 180, so that data signals are written into the second pixel circuits 180.

As shown in FIG. 17, the second peripheral region S2 includes a bonding region B, the bonding region B is proximate to an edge of the display panel 100, and the plurality of first data lines 160 and the plurality of second data lines 180 extend to the bonding region B to be bonded to an external circuit.

It will be noted that, the positions of the plurality of first data lines 160 may be set by those skilled in the art according to actual situations, such as sizes of the display panel 100 and an actual wiring region, which is not limited herein.

For example, as shown in FIG. 17, in the column direction in which the light-emitting devices 110 are arranged (i.e., the vertical direction Y in FIG. 17), the plurality of first pixel circuits 120 are located on one of two opposite sides of the first display region A1 away from the edge of the display panel 100. The plurality of first data lines 160 and the plurality of second data lines 180 extend in a same direction (e.g., the vertical direction Y in FIG. 17), and orthographic projections of the plurality of first data lines 160 on the substrate 101 overlap with the second display region A2.

The plurality of first data lines 160 and the plurality of second data lines 180 are not arranged in a same pattern layer. For example, the plurality of first data lines 160 are farther away from the substrate 101 than the plurality of second data lines 180. In this case, a wiring region of the plurality of first data lines 160 overlaps with a wiring region of the plurality of second data lines 180, which may save a wiring space of the plurality of first data lines 160 in the display panel 100, thereby facilitating the narrow bezel of the display panel 100.

In addition, in a case where the second peripheral region S2 includes the bonding region B, the first display region A1 is proximate to one of two opposite edges of the display panel 100 in an extension direction of the second data lines, and the bonding region B is proximate to the other of the two opposite edges of the display panel 100 in the extension direction of the second data lines. As shown in FIG. 17, the plurality of first data lines 160 extend from the first pixel circuits 120 to the bonding region B through the second display region A2, and the orthographic projections of the plurality of first data lines 160 on the substrate 101 do not overlap with the first display region A1, which may prevent the plurality of first data lines 160 from shielding the first display region A1, thereby improving the transmittance of the first display region A1.

Figure 18:
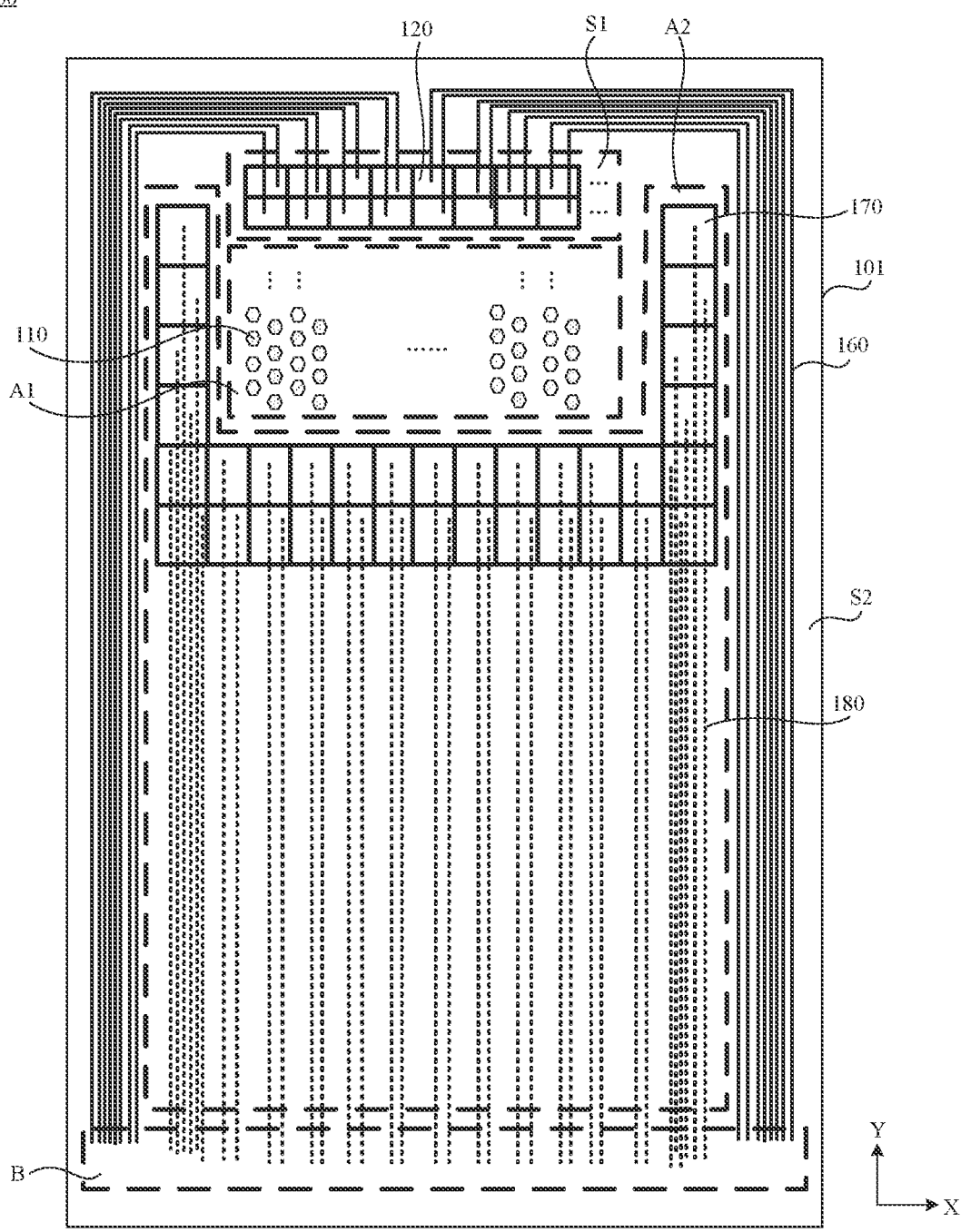
FIG. 18 is a structural diagram of yet another display panel, in accordance with some embodiments.

For example, as shown in FIG. 18, in the column direction in which the light-emitting devices 110 are arranged (i.e., the vertical direction Y in FIG. 18), the plurality of first pixel circuits 120 are located on one of the two opposite sides of the first display region A1 proximate to the edge of the display panel 100. The orthographic projections of the plurality of first data lines 160 on the substrate 101 do not overlap with the second display region A2. For example, the first peripheral region may overlap with the second peripheral region, and the first peripheral region may be located within the second peripheral region. It can be understood that, the orthographic projections of the plurality of first data lines 160 on the substrate 101 do not overlap with orthographic projections of the plurality of second data lines 180 on the substrate 101, and the plurality of first data lines 160 and the plurality of second data lines 180 may be arranged in the same layer. Therefore, the plurality of first data lines 160 and the plurality of second data lines 180 may be formed by patterning a same film layer, which simplifies the production process and saves the production cost.

In addition, in a case where the second peripheral region S2 includes the bonding region B, the first display region A1 is proximate to one of the two opposite edges of the display panel 100 in the extension direction of the second data lines 180, and the bonding region B is proximate to the other of the two opposite edges of the display panel 100 in the extension direction of the second data lines 180. As shown in FIG. 18, in the extension direction of the second data lines 180 (i.e., the vertical direction Y in FIG. 18), the plurality of first data lines 160 extend from a side of the first display region A1 proximate to the edge of the display panel 100 to the bonding region B through a periphery of the second display region A2. The orthographic projections of the plurality of first data lines 160 on the substrate 101 do not overlap with the first display region A1, which may prevent the plurality of first data lines 160 from shielding the first display region A1 thereby improving the transmittance of the first display region A1.

For example, in a case where the first driving circuit 140 and the plurality of first pixel circuits 120 are located on a side, proximate to the edge of the display panel 100, of the two opposite sides of the first display region A1 in the column direction in which the light-emitting devices 110 are arranged, the plurality of first pixel circuits 120 are closer to the first display region A1 than the first driving circuit 140.

For example, the display panel further includes at least one third driving circuit. The plurality of second pixel circuits are coupled to the at least one third driving circuit.

The second driving circuit coupled to the first pixel circuit corresponds to the third driving circuit coupled to the second pixel circuit. For example, if there are two second driving circuits coupled to the first pixel circuits, then there are two third driving circuits coupled to the second pixel circuits. In addition, the driving circuit coupled to the first pixel circuits and the driving circuit coupled to the second pixel circuits cooperate with each other. For example, when the driving circuits (e.g., the first driving circuit and the second driving circuit) coupled to the first pixel circuits drives a row of light-emitting devices in the first display region to be lit up, the driving circuit (e.g., the third driving circuit) coupled to the second pixel circuits also drives a corresponding row of light-emitting devices in the second display region to be lit up. Therefore, the light-emitting devices 110 in the display panel may be lit up row by row, and in turn, the normal display of the display panel is guaranteed.

Figure 19:
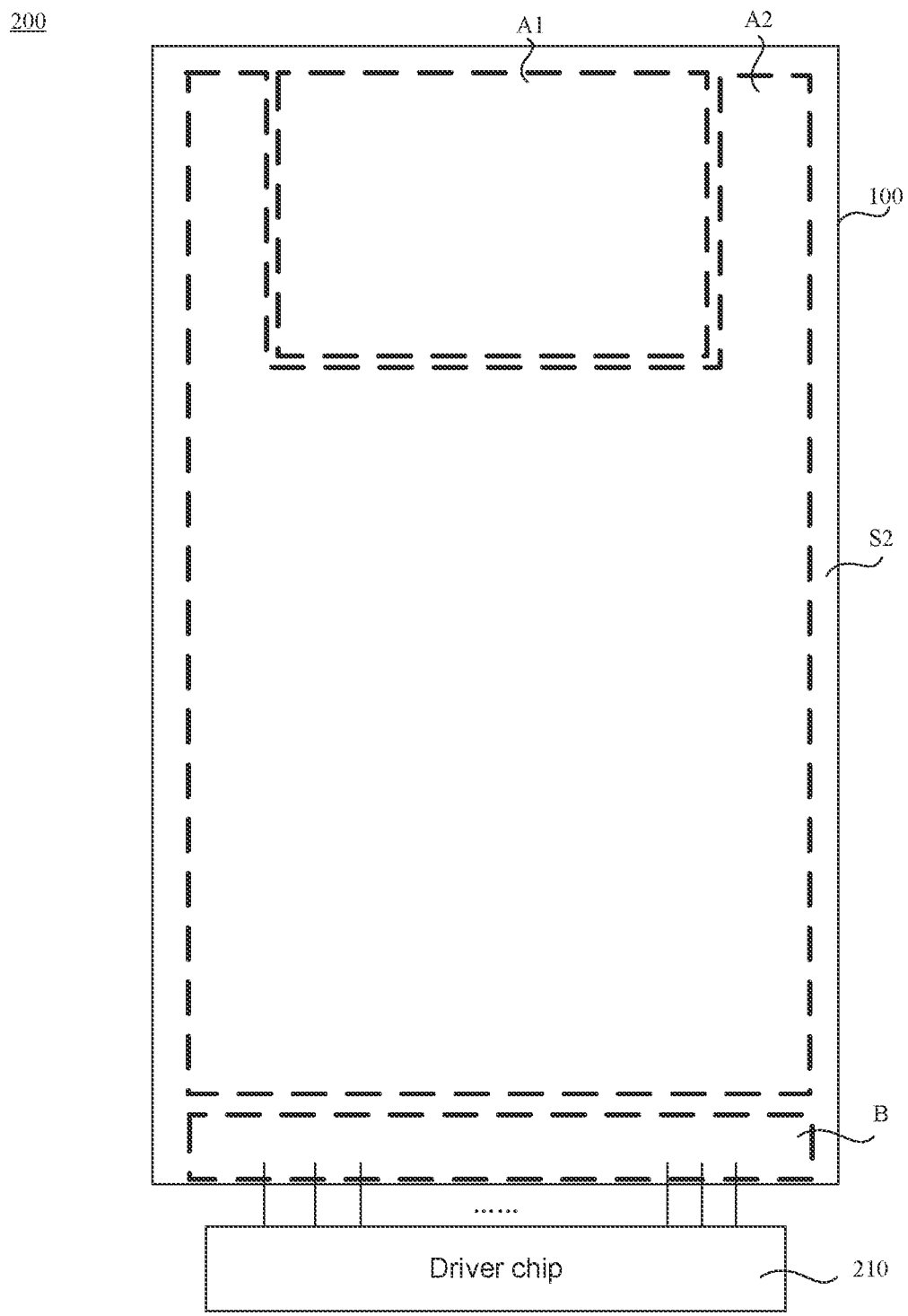
FIG. 19 is a structural diagram of a display apparatus, in accordance with some embodiments.

Embodiments of the present disclosure provide a display apparatus 200. As shown in FIG. 19, the display apparatus 200 includes the display panel 100 described in any of the above embodiments and a driver chip 210. The driver chip 210 is coupled to the display panel 100.

The driver chip 210 is configured to provide control signals to the gating circuit 130 in the display panel 100 (referring to FIG. 4), and to provide data signals to the plurality of first pixel circuits 120 in the display panel 100.

For example, in a case where the display panel 100 includes the first driving circuit 140 and the second driving circuit 150 (referring to FIG. 13), the driver chip 210 is coupled to the first driving circuit 140 and the second driving circuit 150, and the driver chip 210 is configured to input driving control signals (e.g., a clock signal and a power voltage) to the first driving circuit 140 and the second driving circuit 150, so as to drive the first driving circuit 140 to transmit control signals to the plurality of control signal lines 131, and drive the second driving circuit 150 to transmit scan signals to the plurality of first pixel circuits 120.

For example, the driver chip 210 may be an integrated circuit (IC). The driver chip 210 includes a driver IC (i.e., a source IC) and a display driver IC. The driver IC is configured to provide data signals to the plurality of first pixel circuits 120, and the display driver IC is configured to input driving control signals to the first driving circuits 140 and the second driving circuits 150.

In addition, in a case where the display panel 100 includes the second pixel circuits 170 (referring to FIG. 17), the driver chip 210 is further configured to provide data signals to the second pixel circuits 170. Data signals provided by the same driver IC to the first pixel circuits 120 and the second pixel circuits 170 are different.

In some embodiments, the display apparatus 200 may be any device that displays images whether in motion (e.g., a video) or stationary (e.g., a static image), and whether textual or graphical. More specifically, it is anticipated that the embodiments may be implemented in, or associated with a variety of electronic devices. The variety of electronic apparatuses are, but not limited to, mobile phones, wireless apparatuses, personal data assistants (PDAs), hand-held or portable computers, GPS receivers/navigators, cameras, MP4 video players, video cameras, game consoles, watches, clocks, calculators, television monitors, flat panel displays, computer monitors, auto displays (e.g., odometer displays), navigators, cockpit controllers and/or displays, camera view displays (e.g., rear-view camera displays in vehicles), electronic photos, electronic billboards or signs, projectors, architectural structures, packages, and aesthetic structures (e.g., displays for displaying an image of a piece of jewelry).

It will be noted that the display apparatus 200 has the same beneficial effects as the display panel 100 described above, and details will not be repeated here.

Embodiments of the present disclosure provide a method for driving a display panel, and the display panel is the display panel 100 described in any one of the above embodiments. The method includes as follows.

Referring to FIG. 4, at least two data signals are output to a first pixel circuit 110 sequentially, and the at least two data signals are configured to drive at least two light-emitting devices 110 coupled to the first pixel circuit 120.

At least two control signals are output to the gating circuit 130 sequentially, so that the at least two light-emitting devices coupled to the first pixel circuit 120 are turned on to form conductive paths in a time-division manner, and each light-emitting device is driven to emit light by a driving current corresponding to a data signal used for driving the light-emitting device 110.

It will be noted that, the method for driving the display panel has the same beneficial effects as the display panel 100 described above, and details will not be repeated here.

With reference to signal timing diagrams, operation processes of the display panel 100 in different phases will be described below. Here, transistors 133 in the gating circuit 130 and transistors in the first pixel circuit 120 are all P-type transistors. That is, each transistor in the display panel 100 is turned on under control of a low-level signal, and is turned off under control of a high-level signal.

Figure 20:
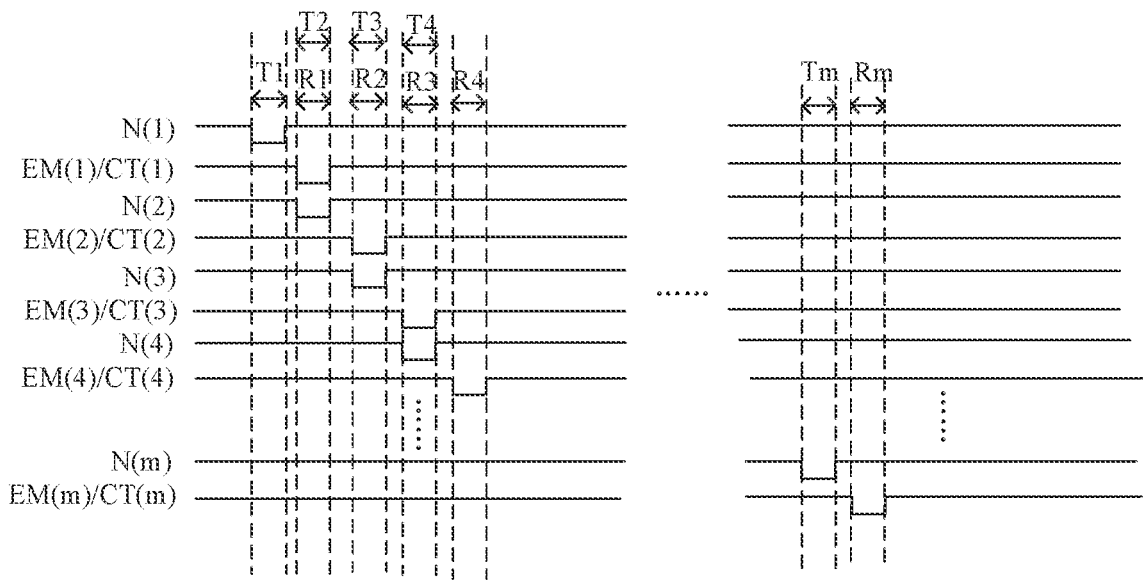
FIG. 20 is a timing diagram of signals used for driving a display panel, in accordance with some embodiments.
Figure 21:
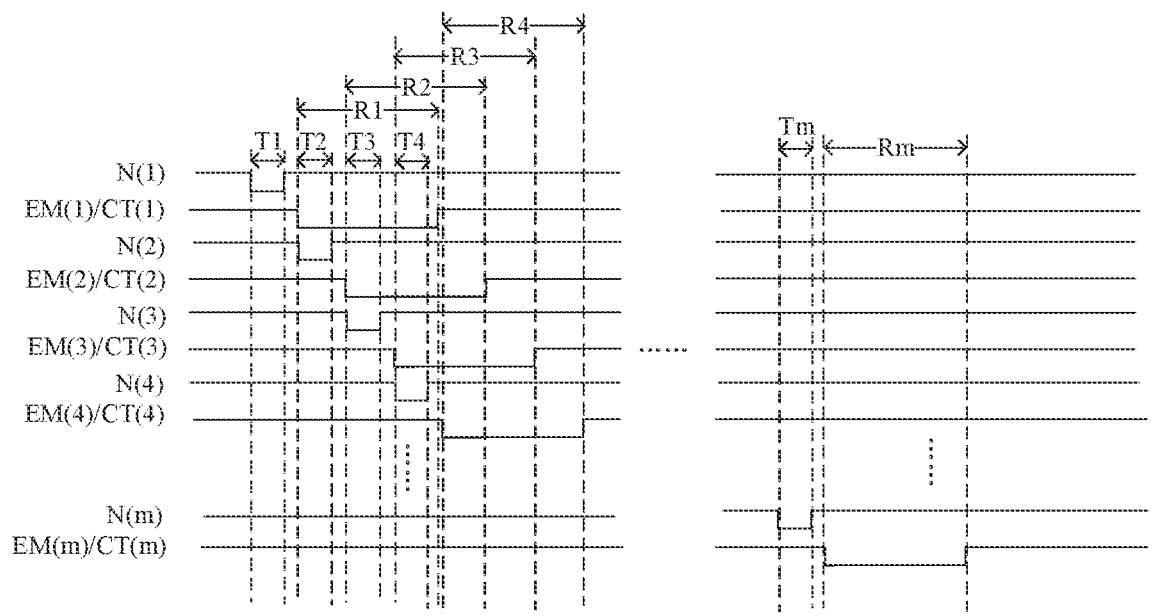
FIG. 21 is a timing diagram of signals used for driving a display panel, in accordance with some other embodiments.

It will be noted that, as shown in FIGS. 20 and 21, a frame period includes scanning phases (T1, . . . , Tm) of pixel circuits and operating phases (R1, . . . , Rm) of light-emitting devices. In a case where the first display region of the display panel 100 is provided with K rows of light-emitting devices, in the scanning phase, a first row of first pixel circuits to a K-th row of first pixel circuits (e.g., K is equal to 1920 (K=1920)) are scanned row by row, and data signals are sequentially written into first pixel circuits corresponding to each row of light-emitting devices. After a row of first pixel circuits is scanned, the row of first pixel circuits and a row of light-emitting devices may form conductive paths through the gating circuit 130. For example, transistors 133 are turned on due to a control signal CT transmitted by a control signal line 131, which make the row of first pixel circuits and the row of light-emitting devices form the conductive paths, so that the row of light-emitting devices enters the operating phase.

It can be understood that, all rows of light-emitting devices 110 in the display panel 100 may sequentially enter the operating phase row by row. That is, a first row of light-emitting devices enters the operating phase, then a second row of light-emitting devices enters the operating phase, until a K-th row of light-emitting devices enters the operating phase. Effective duration of a light-emitting signal EM corresponding to each row of light-emitting devices in the operating phase is same as that of a control signal CT transmitted by a control signal line 131.

With reference to a signal timing diagram shown in FIG. 20, the operating processes of the display panel 100 shown in FIG. 4 in different phases will be described below. Two rows of first pixel circuits drive all rows of light-emitting devices. That is, the first row of first pixel circuits and the second row of first pixel circuits operate alternately to drive odd-numbered rows of light-emitting devices and even-numbered rows of light-emitting devices respectively.

For a first row of first pixel circuits, in a scanning phase T1 of pixel circuits, data signals are written into the first row of first pixel circuits under control of a gate signal N(1). For example, referring to FIG. 5, in the first pixel circuit in the first row, the switching transistor M2 and the switching transistor M3 are turned on under the control of the gate signal N(1), and the driving transistor M4 is in a diode-conducting state. In this case, a data signal is written into the first pixel circuit in the first row through the switching transistor M2 in the first pixel circuit in the first row.

For a first row of light-emitting devices, in an operating phase R1 of light-emitting devices, a first row of transistors 133 is turned on under control of a control signal CT(1); under control of a light-emitting signal EM(1), the first row of first pixel circuits forms conductive paths with the first row of light-emitting devices through the driving signal lines 132 and the first row of transistors 133; and the first row of first pixel circuits transmits driving currents to the first row of light-emitting devices through the driving signal lines 132 and the first row of transistors 133, so that the first row of light-emitting devices operates. For example, referring to FIG. 5, the switching transistor M5 and the switching transistor M6 in the first pixel circuit in the first row are turned on under the control of the light-emitting signal EM(1), and the transistor 133 in the first row is turned on under the control of the control signal CT(1), so that the driving transistor M4, the switching transistor M5 and the switching transistor M6 in the first pixel circuit in the first row form a conductive path with the light-emitting device in the first row. The driving transistor M4 in the first pixel circuit in the first row generates a driving current according to the data signal, and transmits the driving current to the light-emitting device in the first row, so as to drive the light-emitting device in the first row to emit light.

It will be noted that, for all rows of light-emitting devices coupled to a single row of first pixel circuits, if one row of light-emitting devices operates, transistors 133 corresponding to the remaining rows of light-emitting devices are all in an off state under control of control signals. Therefore, the remaining rows of light-emitting devices coupled to the row of first pixel circuits will not form conductive paths with the row of first pixel circuits, and the remaining rows of light-emitting devices do not operate. For example, referring to FIG. 4, for odd-numbered rows of light-emitting devices coupled to the first row of first pixel circuits, if the first row of light-emitting devices operates, transistors 133 corresponding to the remaining rows of light-emitting devices (such as a third row of light-emitting devices) are all in an off state under control of control signals. Therefore, the remaining rows of light-emitting devices will not form conductive paths with the first row of first pixel circuits, and the remaining rows of light-emitting devices do not operate.

In addition, in the scanning phase, first pixel circuits in each row will also be reset before data signals are written into the first pixel circuits in each row. For example, while data signals are written into a current-row of first pixel circuits, a next-row of first pixel circuits is reset. As for the specific reset process, reference may be made to the above description, which will not be described here. For convenience of description, FIGS. 20 and 21 do not show the signal timing of the first pixel circuit in a reset period, but only show the signal timing of the first pixel circuit in a data writing period and a driving light-emitting period.

On this basis, for a second row of first pixel circuits, in a scanning phase T2 of pixel circuits, data signals are written into the second row of first pixel circuits under control of a gate signal N(2). For example, referring to FIG. 5, in the first pixel circuit in the second row, the switching transistor M2 and the switching transistor M3 are turned on under the control of the gate signal N(2), and the driving transistor M4 is in a diode-conducting state. In this case, a data signal is written into the first pixel circuit in the second row through the switching transistor M2 in the first pixel circuit in the second row.

It will be noted that, while a row of light-emitting devices starts to operate, a row of first pixel circuits coupled to a next-row of light-emitting devices may start to perform data writing. For example, while the first row of light-emitting devices starts to operate, first pixel circuits (e.g., the second row of first pixel circuits) coupled to the second row of light-emitting devices start to perform data writing.

For the second row of light-emitting devices, in an operating phase R2 of light-emitting devices, a second row of transistors 133 is turned on under control of a control signal CT(2); under control of a light-emitting signal EM(2), the second row of first pixel circuits forms conductive paths with the second row of light-emitting devices through the driving signal lines 132 and the second row of transistors 133; and the second row of first pixel circuits transmits driving currents to the second row of light-emitting devices through the driving signal lines 132 and the second row of transistors 133, so that the second row of light-emitting devices operates. For example, referring to FIG. 5, the switching transistor M5 and the switching transistor M6 in the first pixel circuit in the second row are turned on under the control of the light-emitting signal EM(2), and the transistor 133 in the second row is turned on under the control of the control signal CT(2), so that the driving transistor M4, the switching transistor M5 and the switching transistor M6 in the first pixel circuit in the second row form a conductive path with the light-emitting device in the second row. The driving transistor M4 in first pixel circuit in the second row generates a driving current according to the data signal, and transmits the driving current to the light-emitting device in the second row, so as to drive the light-emitting device in the second row to emit light.

In addition, referring to FIG. 4, in a case where the second row of light-emitting devices operates, transistors 133 corresponding to the remaining rows of light-emitting devices (such as a fourth row of light-emitting devices) coupled to the second row of first pixel circuits are all in an off state under control of control signals. Therefore, the remaining rows of light-emitting devices coupled to the second row of first pixel circuits will not form conductive paths with the second row of first pixel circuits, and the remaining rows of light-emitting devices coupled to the second row of first pixel circuits do not operate.

It will be noted that, in the processes of driving the third row of light-emitting devices to the K-th row of light-emitting devices, the first row of first pixel circuits and the second row of first pixel circuits operate alternately and periodically. As for the operating processes of the first row of first pixel circuits and the second row of first pixel circuits, reference may be made to the above processes of driving the first row of light-emitting devices and the second row of light-emitting devices, which will not be described here.

In this case, the plurality of light-emitting devices 110 in the first display region A1 are driven by the two rows of first pixel circuits, and an operating (light-emitting) duration of a single row of light-emitting devices is a difference between a driving cycle of the two rows of first pixel circuits and duration of a scanning phase (e.g., a data writing period) of a single row of first pixel circuits. For example, the driving cycle of the two rows of first pixel circuits is duration between a start moment of a scanning phase of the first row of first pixel circuits when the first row of first pixel circuits drives the first row of light-emitting devices to operate and an end moment of an operating phase of the second row of first pixel circuits when the second row of first pixel circuits drives the second row of light-emitting devices to operate. That is, the driving cycle of the two rows of first pixel circuits is duration between the start moment of the scanning phase of the first row of first pixel circuits when the first row of first pixel circuits drives the first row of light-emitting devices to operate and a start moment of a scanning phase of the first row of first pixel circuits when the first row of first pixel circuits drives the third row of light-emitting devices to operate. In this case, the operating duration of the first row of light-emitting devices is a difference between duration of the driving cycle of the two rows of first pixel circuits and duration of the scanning phase of the first row of first pixel circuits, which may be approximately equal to duration of the scanning phase of the second row of first pixel circuits.

In addition, there is a certain time period between an end moment of a data writing period of a row of first pixel circuits corresponding to a row of light-emitting devices and a start moment of a light-emitting period of the row of light-emitting devices. In this way, it is possible to avoid a problem that the light-emitting device has already started to emit light before the data writing of the first pixel circuit is ended, and avoid the reduction of the light-emitting effect.

With reference to a signal timing diagram shown in FIG. 21, the operating process of the display panel 100 shown in FIG. 7 in different phases will be described below. All rows of light-emitting devices are driven by four rows of first pixel circuits. A first row of first pixel circuits to a fourth row of first pixel circuits operate sequentially and periodically.

For the first row of first pixel circuits, in a scanning phase T1 of pixel circuits, data signals are written into the first row of first pixel circuits under control of a gate signal N(1). For example, referring to FIG. 5, in the first pixel circuit in the first row, the switching transistor M2 and the switching transistor M3 are turned on under the control of the gate signal N(1), and the driving transistor M4 is in a diode-conducting state. In this case, a data signal is written into the first pixel circuit in the first row through the switching transistor M2 in the first pixel circuit in the first row.

For a first row of light-emitting devices, in an operating phase R1 of light-emitting devices, a first row of transistors 133 is turned on under control of a control signal CT(1); under control of a light-emitting signal EM(1), the first row of first pixel circuits forms conductive paths with the first row of light-emitting devices through the driving signal lines 132 and the first row of transistors 133; and the first row of first pixel circuits transmits driving currents to the first row of light-emitting devices through the driving signal lines 132 and the first row of transistors 133, so that the first row of light-emitting devices operates. For example, referring to FIG. 5, the switching transistor M5 and the switching transistor M6 in the first pixel circuit in the first row are turned on under the control of the light-emitting signal EM(1), and the transistor 133 in the first row is turned on under the control of the control signal CT(1), so that the driving transistor M4, the switching transistor M5 and the switching transistor M6 in the first pixel circuit in the first row form a conductive path with the light-emitting device in the first row. The driving transistor M4 in the first pixel circuit in the first row generates a driving current according to the data signal, and transmits the driving current to the light-emitting device in the first row, so as to drive the light-emitting device in the first row to emit light.

For a second row of first pixel circuits, in a scanning phase T2 of pixel circuits, data signals are written into the second row of first pixel circuits under control of a gate signal N(2). For example, referring to FIG. 5, in the first pixel circuit in the second row, the switching transistor M2 and the switching transistor M3 are turned on under the control of the gate signal N(2), and the driving transistor M4 is in a diode-conducting state. In this case, a data signal is written into the first pixel circuit in the second row through the switching transistor M2 in the first pixel circuit in the second row.

For a second row of light-emitting devices, in an operating phase R2 of light-emitting devices, a second row of transistors 133 is turned on under control of a control signal CT(2); under control of a light-emitting signal EM(2), the second row of first pixel circuits forms conductive paths with the second row of light-emitting devices through the driving signal lines 132 and the second row of transistors 133, and the second row of first pixel circuits transmits driving currents to the second row of light-emitting devices through the driving signal lines 132 and the second row of transistors 133, so that the second row of light-emitting devices operates. For example, referring to FIG. 5, the switching transistor M5 and the switching transistor M6 in the first pixel circuit in the second row are turned on under the control of the light-emitting signal EM(2), and the transistor 133 in the second row is turned on under the control of the control signal CT(2), so that the driving transistor M4, the switching transistor M5 and the switching transistor M6 in the first pixel circuit in the second row form a conductive path with the light-emitting device in the second row. The driving transistor M4 in the first pixel circuit in the second row generates a driving current according to the data signal, and transmits the driving current to the light-emitting device in the second row, so as to drive the light-emitting device in the second row to emit light.

For a third row of first pixel circuits, in a scanning phase T3 of pixel circuits, data signals are written into the third row of first pixel circuits under control of a gate signal N(3). For example, referring to FIG. 5, in the first pixel circuit in the third row, the switching transistor M2 and the switching transistor M3 are turned on under the control of the gate signal N(3), and the driving transistor M4 is in a diode-conducting state. In this case, a data signal is written into the first pixel circuit in the third row through the switching transistor M2 in the first pixel circuit in the third row.

For a third row of light-emitting devices, in an operating phase R3 of light-emitting devices, a third row of transistors 133 is turned on under control of a control signal CT(3); under control of a light-emitting signal EM(3), the third row of first pixel circuits forms conductive paths with the third row of light-emitting devices through the driving signal lines 132 and the third row of transistors 133, and the third row of first pixel circuits transmits driving currents to the third row of light-emitting devices through the driving signal lines 132 and the third row of transistors 133, so that the third row of light-emitting devices operates. For example, referring to FIG. 5, the switching transistor M5 and the switching transistor M6 in the first pixel circuit in the third row are turned on under the control of the light-emitting signal EM(3), and the transistor 133 in the third row is turned on under the control of the control signal CT(3), so that the driving transistor M4, the switching transistor M5 and the switching transistor M6 in the first pixel circuit in the third row form a conductive path with the light-emitting device in the third row. The driving transistor M4 in the first pixel circuit the third row generates a driving current according to the data signal, and transmits the driving current to the light-emitting device in the third row, so as to drive the light-emitting device in the third row to emit light.

For the fourth row of first pixel circuits, in a scanning phase T4 of pixel circuits, data signals are written into the fourth row of first pixel circuits under control of a gate signal N(4). For example, referring to FIG. 5, in the first pixel circuit in the fourth row, the switching transistor M2 and the switching transistor M3 are turned on under the control of the gate signal N(4), and the driving transistor M4 is in a diode-conducting state. In this case, a data signal is written into the first pixel circuit in the fourth row through the switching transistor M2 in the first pixel circuit in the fourth row.

For a fourth row of light-emitting devices, in an operating phase R4 of light-emitting devices, a fourth row of transistors 133 is turned on under control of a control signal CT(4); under control of a light-emitting signal EM(4), the fourth row of first pixel circuits forms conductive paths with the fourth row of light-emitting devices through the driving signal lines 132 and the fourth row of transistors 133, and the fourth row of first pixel circuits transmits driving currents to the fourth row of light-emitting devices through the driving signal lines 132 and the fourth row of transistors 133, so that the fourth row of light-emitting devices operates. For example, referring to FIG. 5, the switching transistor M5 and the switching transistor M6 in the first pixel circuit in the fourth row are turned on under the control of the light-emitting signal EM(4), and the transistor 133 in the fourth row is turned on under the control of the control signal CT(4), so that the driving transistor M4, the switching transistor M5 and the switching transistor M6 in the first pixel circuit in the fourth row form a conductive path with the light-emitting device in the fourth row. The driving transistor M4 in the first pixel circuit in the fourth row generates a driving current according to the data signal, and transmits the driving current to the light-emitting device in the fourth row, so as to drive the light-emitting device in the fourth row to emit light.

It will be noted that, in the processes of driving a fifth row of light-emitting devices to the K-th row of light-emitting devices, the first row of first pixel circuits to the fourth row of first pixel circuits operate sequentially and periodically. As for the operating processes of the first row of first pixel circuits to the fourth row of first pixel circuits, reference may be made to the above processes of driving the first row of light-emitting devices to the fourth row of light-emitting devices, which will not be described here.

After the first row of first pixel circuits drives the first row of light-emitting devices, the first row of first pixel circuits does not enter the scanning phase again until the fifth row of light-emitting devices is driven. When the fourth row of light-emitting devices starts to emit light, data signals for driving the fifth row of light-emitting devices are written into the first row of first pixel circuits.

In this case, the plurality of light-emitting devices 110 in the first display region A1 are driven by the four rows of first pixel circuits, and an operating (light-emitting) duration of a single row of light-emitting devices is a difference between a driving cycle of the four rows of first pixel circuits and duration of a scanning phase of a single row of first pixel circuits. For example, the driving cycle of the four rows of first pixel circuits is duration between a start moment of a scanning phase of the first row of first pixel circuits when the first row of first pixel circuits drives the first row of light-emitting devices to operate and an end moment of an operating phase of the fourth row of first pixel circuits when the fourth row of first pixel circuits drives the fourth row of light-emitting devices to operate. That is, the driving cycle of the four rows of first pixel circuits is duration between the start moment of the scanning phase of the first row of first pixel circuits when the first row of first pixel circuits drives the first row of light-emitting devices to operate and a start moment of a scanning phase of the first row of first pixel circuits when the first row of first pixel circuits drives the fifth row of light-emitting devices to operate. In this case, the operating duration of the first row of light-emitting devices is a difference between duration of the driving cycle of the four rows of first pixel circuits and duration of the scanning phase of the first row of first pixel circuits, which may be approximately equal to duration of scanning phases of the second row of first pixel circuits to the fourth row of first pixel circuits.

Therefore, in a case where the plurality of light-emitting devices 110 in the first display region A1 are driven by Q rows of first pixel circuits, Q being an integer greater than 1, an operating duration of a row of light-emitting devices is a difference between a driving cycle of the Q rows of first pixel circuits and duration of a scanning phase of a row of first pixel circuits, which may be approximately equal to duration of scanning phase(s) of (Q−1) rows of first pixel circuits.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel having a first display region, a second display region, a first peripheral region and a second peripheral region, wherein the first peripheral region is located outside the first display region, the second peripheral region is located outside the second display region, and a transmittance of the first display region is greater than a transmittance of the second display region; the display panel comprising:
   a substrate;
   a plurality of light-emitting devices disposed on the substrate and located in the first display region;
   a plurality of first pixel circuits disposed on the substrate and located in the first peripheral region;
   a gating circuit disposed on the substrate and coupled to the plurality of light-emitting devices and the plurality of first pixel circuits, wherein the gating circuit is configured to connect each first pixel circuit to at least two light-emitting devices in a time-division manner, so as to drive the light-emitting devices connected to the first pixel circuit to emit light;
   a plurality of first data lines disposed on the substrate, wherein the plurality of first data lines are coupled to the plurality of first pixel circuits;
   a plurality of second pixel circuits disposed on the substrate and located in the second display region; and
   a plurality of second data lines disposed on the substrate, wherein the plurality of second data lines are coupled to the plurality of second pixel circuits,
   wherein in a column direction in which the plurality of light-emitting devices are arranged, the plurality of first pixel circuits are located on a side of two opposite sides of the first display region away from an edge of the display panel; and
   the plurality of first data lines and the plurality of second data lines extend in a same direction, and orthographic projections of the plurality of first data lines on the substrate overlap with the second display region.

2. The display panel according to claim 1, wherein the gating circuit includes:
   a plurality of control signal lines;
   a plurality of driving signal lines coupled to the plurality of first pixel circuits; and a plurality of transistors, wherein a control electrode of each transistor is coupled to a control signal line, a first electrode of the transistor is coupled to a driving signal line, and a second electrode of the transistor is coupled to a light-emitting device.

3. The display panel according to claim 2, wherein the plurality of driving signal lines are arranged in a same layer, and the plurality of driving signal lines are transparent.

4. The display panel according to claim 2, wherein the plurality of light-emitting devices are divided into first light-emitting device columns and second light-emitting device columns, and the first light-emitting device columns and the second light-emitting device columns are sequentially arranged at intervals;
   transistors coupled to light-emitting devices in a row in the first light-emitting device columns and transistors coupled to light-emitting devices in a corresponding row in the second light-emitting device columns are coupled to a same control signal line; and
   two transistors coupled to adjacent two light-emitting devices in each of the first light-emitting device columns and the second light-emitting device columns are coupled to different first pixel circuits through different driving signal lines.

5. The display panel according to claim 4, wherein transistors coupled to each of the first light-emitting device columns and the second light-emitting device columns are coupled to a column of first pixel circuits; the column of first pixel circuits includes N first pixel circuits, N being an integer greater than 1; and
   transistors coupled to light-emitting devices continuously distributed in every N rows in a first light-emitting device column or a second light-emitting device column are respectively coupled to the N first pixel circuits in the column of first pixel circuits in sequence.

6. The display panel according to claim 5, wherein the column of first pixel circuits includes two first pixel circuits; for the first light-emitting device column or the second light-emitting device column coupled to the column of first pixel circuits, transistors coupled to light-emitting devices in odd-numbered rows are coupled to one first pixel circuit of the two first pixel circuits, and transistors coupled to light-emitting devices in even-numbered rows are coupled to another first pixel circuit of the two first pixel circuits.

7. The display panel according to claim 2, wherein transistors coupled to a same first pixel circuit are coupled to a same driving signal line.

8. The display panel according to claim 2, wherein the plurality of transistors are located on a side of the plurality of light-emitting devices proximate to the substrate; and an orthographic projection of at least one transistor on the substrate overlaps with orthographic projections of the plurality of light-emitting devices on the substrate.

9. The display panel according to claim 8, wherein an orthographic projection of each light-emitting device on the substrate overlaps with an orthographic projection of a transistor coupled to each light-emitting device on the substrate.

10. The display panel according to claim 8, wherein transistors coupled to a column of light-emitting devices are divided into a plurality of transistor groups; each transistor group includes at least two transistors; and
    in a column direction in which the plurality of light-emitting devices are arranged, light-emitting devices coupled to the at least two transistors are distributed continuously, and adjacent two transistor groups are separated by at least one light-emitting device.

11. The display panel according to claim 2, wherein the plurality of control signal lines are divided into a plurality of control signal line groups; each control signal line group includes at least two control signal lines; and
    in a column direction in which the plurality of light-emitting devices are arranged, light-emitting devices in a column of light-emitting devices coupled to the at least two control signal lines are distributed continuously, and adjacent two control signal line groups are separated by at least one light-emitting device; a spacing between the at least two control signal lines in the control signal line group is less than a spacing between adjacent two light-emitting devices.

12. The display panel according to claim 2, further comprising:
    at least one first driving circuit disposed in the first peripheral region, wherein the at least one first driving circuit includes a plurality of first shift register circuits connected in cascade, and a first shift register circuit is coupled to a control signal line; and
    at least one second driving circuit disposed in the first peripheral region, wherein each second driving circuit includes a plurality of second shift register circuits connected in cascade, and a second shift register circuit is coupled to a row of first pixel circuits.

13. The display panel according to claim 12, wherein in a column direction in which the plurality of light-emitting devices are arranged, the at least one first driving circuit is located on a side of two opposite sides of the first display region proximate to an edge of the display panel.

14. The display panel according to claim 12, wherein the at least one first driving circuit includes first driving circuits, and the first driving circuits are located on two opposite sides of the first display region in a direction perpendicular to a column direction in which the plurality of light-emitting devices are arranged; or
    the at least one first driving circuit is located on one of the two opposite sides of the first display region in the direction perpendicular to the column direction in which the plurality of light-emitting devices are arranged.

15. The display panel according to claim 12, wherein the at least one second driving circuit includes second driving circuits, and the second driving circuits are located on two opposite sides of the first display region in a direction perpendicular to a column direction in which the plurality of light-emitting devices are arranged.

16. A display apparatus, comprising:
    the display panel according to claim 1; and
    a driver chip coupled to the display panel, wherein the driver chip is configured to provide control signals to the gating circuit in the display panel, and provide data signals to the plurality of first pixel circuits in the display panel.

17. A method for driving a display panel, the display panel being the display panel according to claim 1, the method comprising:
    outputting at least two data signals to a first pixel circuit sequentially through a first data line, the at least two data signals being configured to drive at least two light-emitting devices coupled to the first pixel circuit; and
    outputting at least two control signals to the gating circuit sequentially, so that the at least two light-emitting devices coupled to the first pixel circuit are turned on to form conductive paths in a time-division manner, and each light-emitting device is driven to emit light by a driving current corresponding to a data signal for driving the light-emitting device.

18. A display panel having a first display region, a second display region, a first peripheral region and a second peripheral region, wherein the first peripheral region is located outside the first display region, the second peripheral region is located outside the second display region, and a transmittance of the first display region is greater than a transmittance of the second display region; the display panel comprising:
- a substrate;
- a plurality of light-emitting devices disposed on the substrate and located in the first display region;
- a plurality of first pixel circuits disposed on the substrate and located in the first peripheral region; and
- a gating circuit disposed on the substrate and coupled to the plurality of light-emitting devices and the plurality of first pixel circuits, wherein the gating circuit is configured to connect each first pixel circuit to at least two light-emitting devices in a time-division manner, so as to drive the light-emitting devices connected to the first pixel circuit to emit light,
wherein the gating circuit includes:
- a plurality of control signal lines;
- a plurality of driving signal lines coupled to the plurality of first pixel circuits; and
- a plurality of transistors, wherein a control electrode of each transistor is coupled to a control signal line, a first electrode of the transistor is coupled to a driving signal line, and a second electrode of the transistor is coupled to a light-emitting device,
wherein the plurality of light-emitting devices are divided into first light-emitting device columns and second light-emitting device columns, and the first light-emitting device columns and the second light-emitting device columns are sequentially arranged at intervals;
transistors coupled to light-emitting devices in a row in the first light-emitting device columns and transistors coupled to light-emitting devices in a corresponding row in the second light-emitting device columns are coupled to a same control signal line; and
two transistors coupled to adjacent two light-emitting devices in each of the first light-emitting device columns and the second light-emitting device columns are coupled to different first pixel circuits through different driving signal lines,
wherein transistors coupled to each of the first light-emitting device columns and the second light-emitting device columns are coupled to a column of first pixel circuits; the column of first pixel circuits includes N first pixel circuits, N being an integer greater than 1; and
transistors coupled to light-emitting devices continuously distributed in every N rows in a first light-emitting device column or a second light-emitting device column are respectively coupled to the N first pixel circuits in the column of first pixel circuits in sequence,
wherein the column of first pixel circuits includes two first pixel circuits; for the first light-emitting device column or the second light-emitting device column coupled to the column of first pixel circuits, transistors coupled to light-emitting devices in odd-numbered rows are coupled to one first pixel circuit of the two first pixel circuits, and transistors coupled to light-emitting devices in even-numbered rows are coupled to another first pixel circuit of the two first pixel circuits.

19. A display apparatus, comprising:
the display panel according to claim 18; and
a driver chip coupled to the display panel, wherein the driver chip is configured to provide control signals to the gating circuit in the display panel, and provide data signals to the plurality of first pixel circuits in the display panel.

* * * * *